(12) United States Patent
Jones et al.

(10) Patent No.: US 10,475,937 B1
(45) Date of Patent: Nov. 12, 2019

(54) OPTICAL SENSOR PACKAGES EMPLOYING CLOAKING LAYERS

(71) Applicant: Maxim Integrated Products, Inc., San Jose, CA (US)

(72) Inventors: Joy T. Jones, Fremont, CA (US); John Hanks, Austin, TX (US); Arkadii V. Samoilov, Saratoga, CA (US); Craig A. Easson, San Jose, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 15/941,765

(22) Filed: Mar. 30, 2018

Related U.S. Application Data

(60) Provisional application No. 62/479,035, filed on Mar. 30, 2017, provisional application No. 62/479,029, filed on Mar. 30, 2017, provisional application No. 62/479,017, filed on Mar. 30, 2017.

(51) Int. Cl.

| | | |
|---|---|---|
| *H01L 31/0203* | (2014.01) | |
| *H01L 31/153* | (2006.01) | |
| *H01S 5/183* | (2006.01) | |
| *H01L 31/173* | (2006.01) | |
| *H01L 31/101* | (2006.01) | |
| *H01L 31/12* | (2006.01) | |

(52) U.S. Cl.
CPC ...... *H01L 31/0203* (2013.01); *H01L 31/1016* (2013.01); *H01L 31/125* (2013.01); *H01L 31/153* (2013.01); *H01L 31/173* (2013.01); *H01S 5/183* (2013.01)

(58) Field of Classification Search
CPC ............ H01L 31/0203; H01L 31/0232; H01L 31/042; H01L 31/1016; H01L 31/125; H01L 31/153; H01L 31/173; H01L 33/48; H01L 33/58; H01L 33/173; H01L 33/483; H01L 25/167; H01L 25/0753; H01S 5/183; G01S 17/08; G01S 17/026; G01S 7/481; G01S 7/4813
USPC ........ 257/80, 81, 82, 84, 433, 774, E31.095, 257/E31.096, E31.117, E31.121, E33.076, 257/E23.145; 438/25, 26, 64, 123; 250/338.1, 231.14, 221, 216
See application file for complete search history.

(56) References Cited

U.S. PATENT DOCUMENTS

| | | |
|---|---|---|
| 8,712,485 B2 | 4/2014 | Tam |
| 8,805,302 B2 | 8/2014 | Pantfoerder |
| 8,996,082 B2 | 3/2015 | Tam |

(Continued)

FOREIGN PATENT DOCUMENTS

| | | |
|---|---|---|
| TW | 201419496 A | 5/2014 |

*Primary Examiner* — Dao H Nguyen
(74) *Attorney, Agent, or Firm* — Kevin E. West; Advent, LLP

(57) ABSTRACT

An optical sensor package includes a substrate, a wall disposed upon the substrate, and a cover layer disposed on the wall. The substrate, the wall, and the cover layer at least partially define a cavity. The optical sensor package also includes a sensor disposed upon the substrate within the cavity. A cloaking layer is disposed upon to the cover layer. The cloaking layer is transmissive to at least a portion of a light spectrum and is configured to at least partially conceal the sensor. In some examples, the optical sensor package also includes a light source disposed upon the substrate within another cavity at least partially defined by the wall and the cover layer.

17 Claims, 34 Drawing Sheets

(56) References Cited

U.S. PATENT DOCUMENTS

| | | | |
|---|---|---|---|
| 9,435,886 B2* | 9/2016 | Chen | G01S 7/4811 |
| 9,608,181 B2 | 3/2017 | Geiger | |
| 9,911,890 B2* | 3/2018 | Renard | H01L 31/0203 |
| 10,038,108 B2* | 7/2018 | Luan | G01S 17/026 |
| 2004/0252867 A1 | 12/2004 | Lan | |
| 2012/0248625 A1* | 10/2012 | Coffy | G01S 7/4813 |
| | | | 257/774 |
| 2014/0191253 A1* | 7/2014 | Haslbeck | H01L 31/0203 |
| | | | 257/82 |
| 2015/0226839 A1* | 8/2015 | Brandl | H01L 25/167 |
| | | | 250/221 |
| 2015/0301176 A1* | 10/2015 | Halbritter | H01L 31/0203 |
| | | | 250/216 |
| 2016/0209245 A1 | 7/2016 | Ruh | |
| 2017/0089757 A1* | 3/2017 | Geiger | G01J 1/0295 |

\* cited by examiner

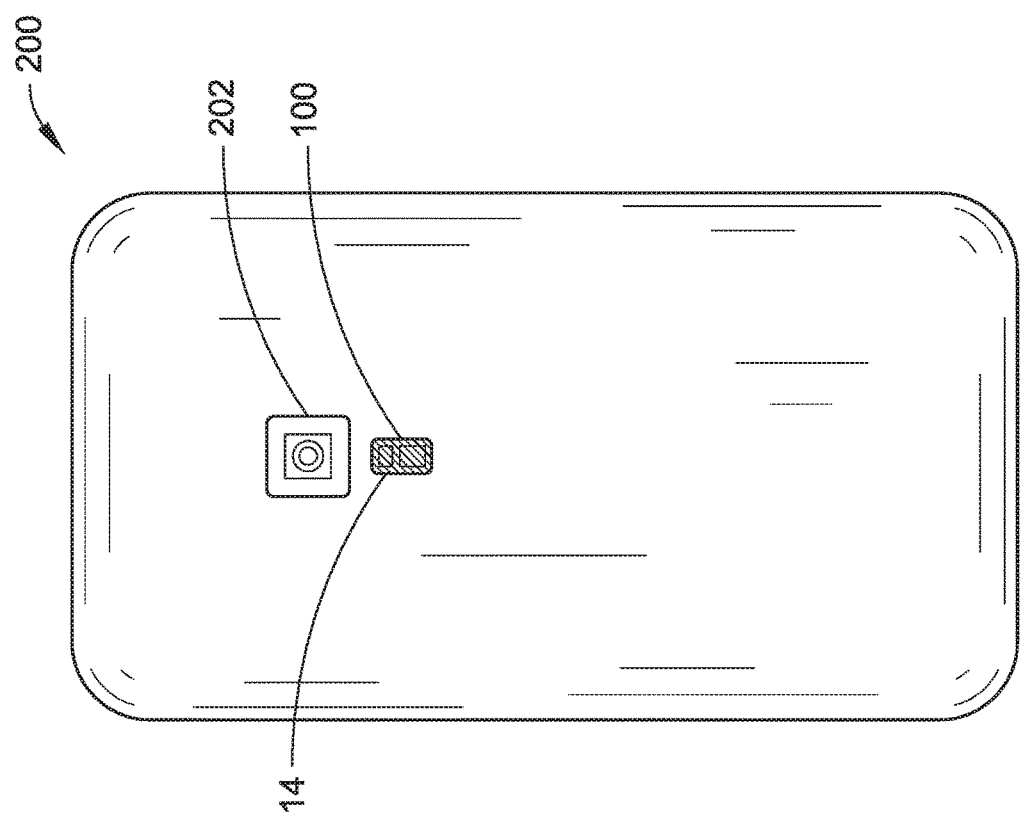
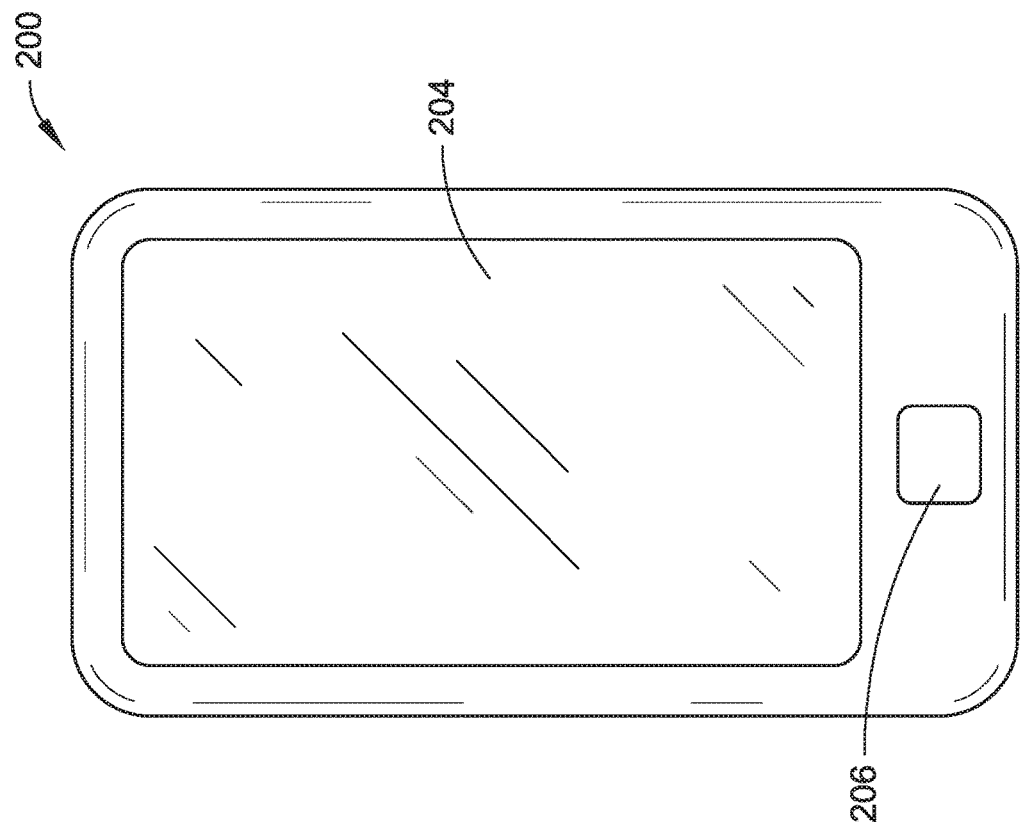
FIG. 1B
FIG. 1A

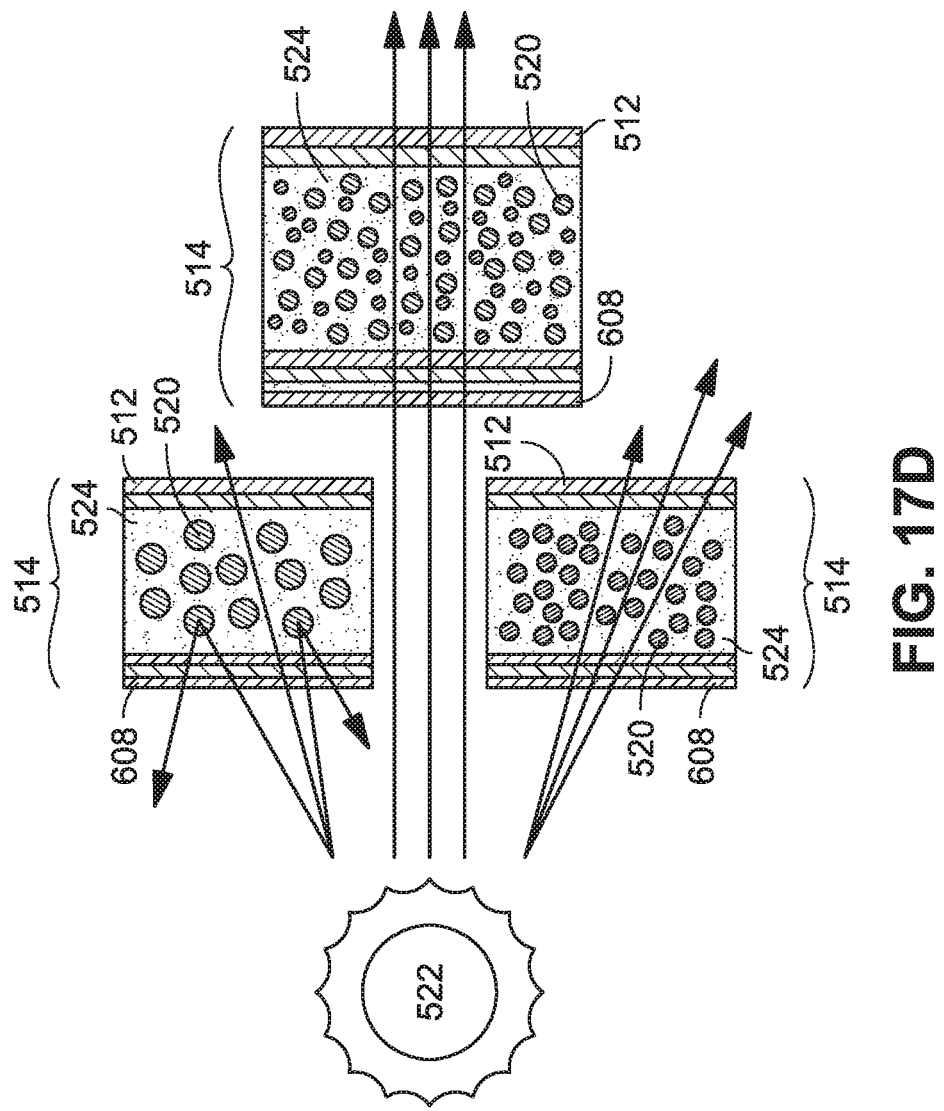

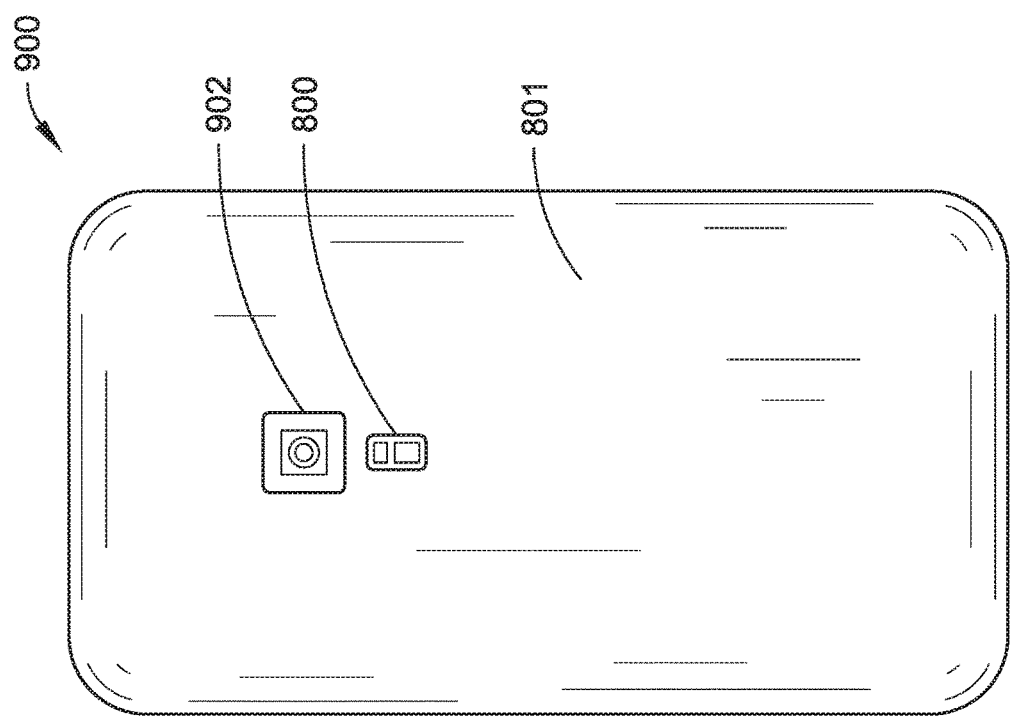
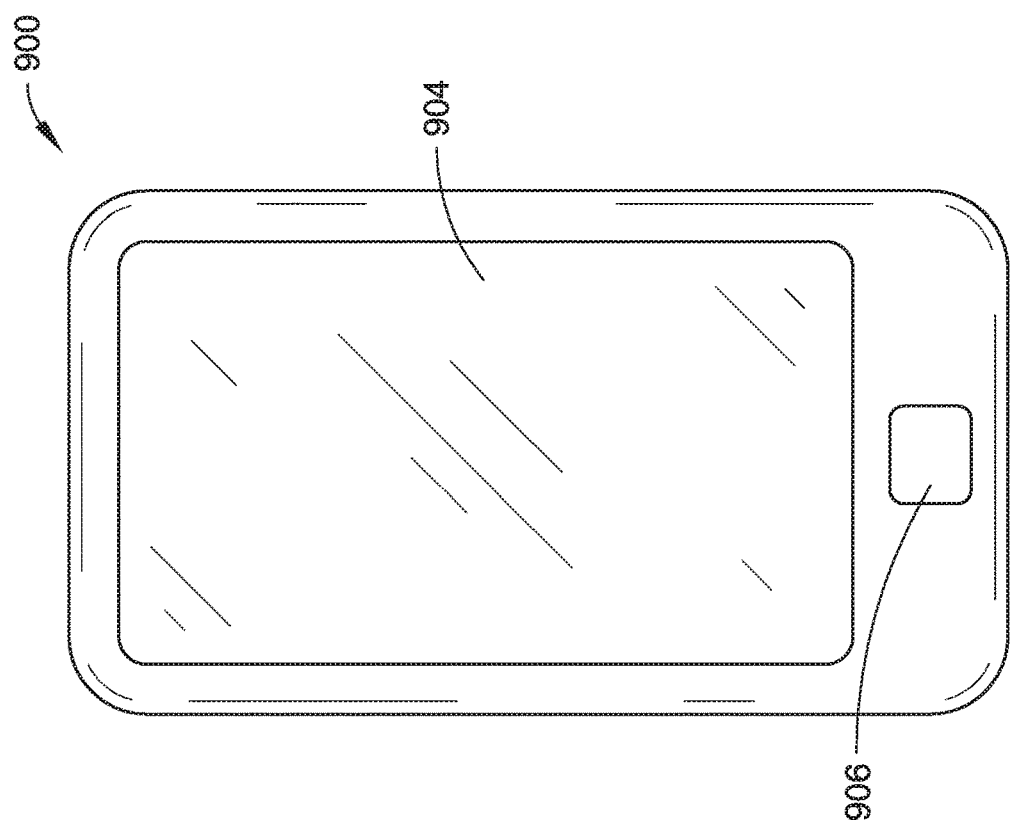
FIG. 20B
FIG. 20A

OPTICAL SENSOR PACKAGES EMPLOYING CLOAKING LAYERS

CROSS-REFERENCE TO RELATED APPLICATIONS

The present application claims the benefit under 35 U.S.C. § 119(e) of U.S. Provisional Application Ser. No. 62/479,035, filed Mar. 30, 2017, and titled "OPTICAL SENSOR PACKAGE EMPLOYING CLOAKING LAYER," and U.S. Provisional Application Ser. No. 62/479,029, filed Mar. 30, 2017 and titled "OPTICAL SENSOR PACKAGE EMPLOYING SWITCHABLE LAYER OVER SENSOR GLASS," and U.S. Provisional Application Ser. No. 62/479,017, filed Mar. 30, 2017, and titled "OPTICAL SENSOR PACKAGE EMPLOYING MIRROR LAYER OVER SENSOR GLASS," all of which are herein incorporated by reference in their entireties.

BACKGROUND

A sensor includes a device that detects or measures a physical property, an event, or a change in its environment. Some examples of sensors are optical sensors, proximity sensors, temperature sensors, and the like. Sensors are employed for a variety of applications, including, but not limited to, image capture (e.g., cameras), light detection, sound detection, temperature detection, gas/particle detection, and so forth. For example, optical sensors may be employed to detect light signals (e.g., UV light, visible light, infrared light, or a combination thereof).

BRIEF DESCRIPTION OF THE DRAWINGS

The detailed description is described with reference to the accompanying figures. The use of the same reference numbers in different instances in the description and the figures may indicate similar or identical items. Various implementations or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

FIG. 1A is a front view illustration of an implementation of a mobile device having an optical sensor package with a cloaking layer, in accordance with an example implementation of the present disclosure.

FIG. 1B is a rear view illustration of an implementation of a mobile device having an optical sensor package with a cloaking layer, in accordance with an example implementation of the present disclosure.

FIG. 17D is a diagrammatic partial cross-sectional side elevation view illustration of a switchable layer configured to be disposed on an optical sensor package, such as the optical sensor packages illustrated in FIGS. 16A through 16D, in accordance with an example implementation of the present disclosure.

FIG. 20A is a front view illustration of an implementation of a mobile device having an optical sensor package with a mirror layer, in accordance with an example implementation of the present disclosure.

FIG. 20B is a rear view illustration of an implementation of a mobile device having an optical sensor package with a mirror layer, in accordance with an example implementation of the present disclosure.

DETAILED DESCRIPTION

Overview

Figure 2A:
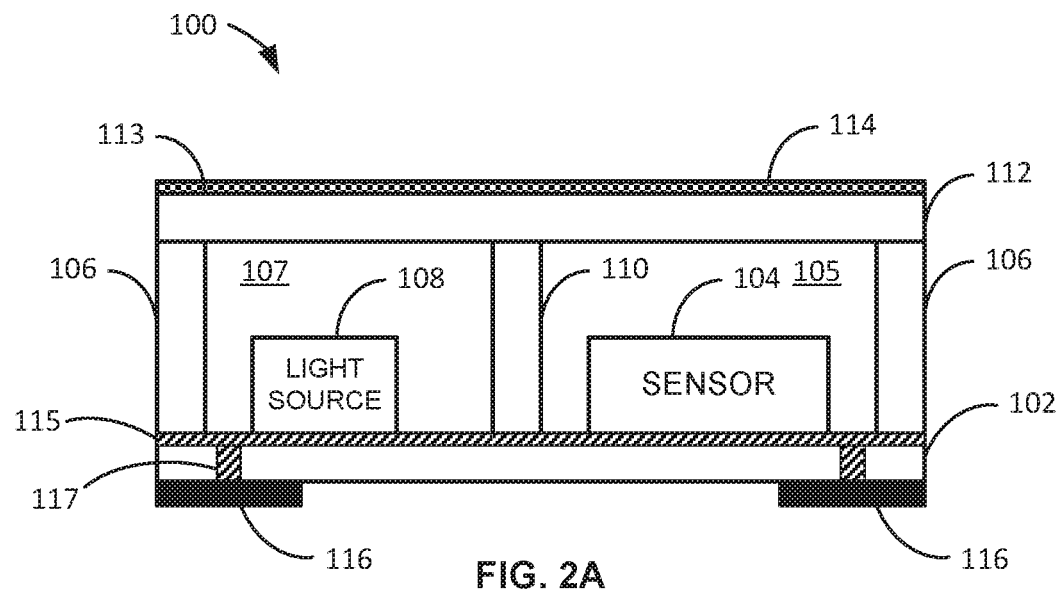
FIG. 2A is a diagrammatic partial cross-sectional side elevation view illustration of an optical sensor package with a cloaking layer, in accordance with an example implementation of the present disclosure.

Optical sensors are prevalent in mobile devices for obtaining measurements, information, and the like. For example, a mobile device may employ a photoelectric sensor to detect the distance, absence, or presence of an object. Some examples of sensors include optical sensors, proximity sensors, physiological sensors, temperature sensors, and so forth. Optical sensors may be configured to convert light or a change in light into an electronic signal. Some optical sensors may include a receiver (e.g., a light sensor, a light detector), such as a photodiode or optionally may include a light source, such as a light emitting diode (LED), a laser or other light source, for example. Example mobile devices include, but are not limited to, smartphones, wearable devices, tablets, smartwatches, digital cameras, notebook computers, media players, portable gaming devices, and the like.

Having an aesthetically pleasing device is desirable for many mobile device users. Optical sensors are often considered not aesthetically pleasing by such users. For example, an optical sensor may be visibly disposed on the outside surface of a mobile device such that it is distracting to the user. Additionally, the inner components of the optical sensor may be visible to the user detracting from the mobile device's otherwise sleek appearance. When using an aesthetically pleasing surface that blocks at least some light wavelengths, a good optical signal is still necessary while blocking and/or allowing the desired light wavelengths.

Accordingly, optical sensor packages, devices, and processes for fabricating optical sensor packages are disclosed. The optical sensor packages include a cloaking layer configured to give the optical sensor package an aesthetically pleasing appearance by concealing the sensor from view. The term "cloaking layer" as used herein refers to a device that is employed to conceal a sensor (e.g., hide or obscure an optical sensor package from view by the naked eye), while still allowing at least a portion of the light spectrum to reach the sensor.

In an implementation, the cloaking layer can be disposed upon the cover layer. In some implementations, the cloaking layer can be disposed below the cover layer or formed by processing at least one surface of the cover layer. In an implementation, the cloaking layer can be transmissive to UV light or infrared light, or a combination thereof, but non-transmissive to visible light. In another implementation, the cloaking layer can be non-transmissive to only a portion of the visible light spectrum (e.g., non-transmissive to red, orange, yellow, green, blue, indigo, or violet light, or a combination thereof). In another implementation, the cloaking layer is opaque and includes at least one aperture that is configured to allow light to reach the sensor without making the sensor visible to or easily seen by the naked eye. In another implementation, the cloaking layer is a switchable layer which, when activated, cloaks the optical sensor package from view. In another implementation, the cloaking layer is a mirror layer.

Example Implementations

FIGS. 2A through 11 illustrate an implementation of an optical sensor package 100 that can be employed in a device, such as a mobile device 200 shown in FIGS. 1A and 1B. The optical sensor package 100 and the mobile device 200 described include a cloaking layer 114 configured to provide an aesthetically pleasing optical sensor package 100 while maintaining sensor functionality. Although mobile device 200 is depicted in FIGS. 1A and 1B, the present application is not limited to the mobile device 200 and other devices may be configured to include the optical sensor package 100, for example.

In an implementation, the optical sensor package 100 can include a substrate 102. In implementations, the substrate 102 can include a panel and/or a board suitable to mechanically support and electrically connect electronic components (e.g., optical sensor, light source, etc.) using conductive tracks, traces, pads, redistribution layers (e.g., a layer of wiring or conductive routing that can electrically couple to a first chip, a second chip, a contact pad, and so forth, and re-route an input/output layout), vias, and other features that may be etched from copper sheets or other electrically conductive material laminated onto a non-conductive substrate. In one implementation, the substrate 102 can be formed from a glass epoxy material (e.g., a printed circuit board), such as FR-4 glass epoxy (a composite material composed of woven fiberglass cloth with an epoxy resin binder). For example, the substrate 102 can include a portion of a printed circuit board, and/or a flexible printed circuit board that has contact pads that are configured to be coupled to a light source 108 and a sensor 104. It is contemplated that the substrate 102 may include other materials, such as other glass epoxy, ceramic, glass, a polymer, and/or silicon. For example, the substrate 102 can include a portion of a glass panel that includes contact pads that are configured to couple to electronic devices, such as the light source 108 and the sensor 104. In some examples, the glass panel may be made from a flexible material. In other examples, the glass panel may have an arcuate profile.

Figure 2B:
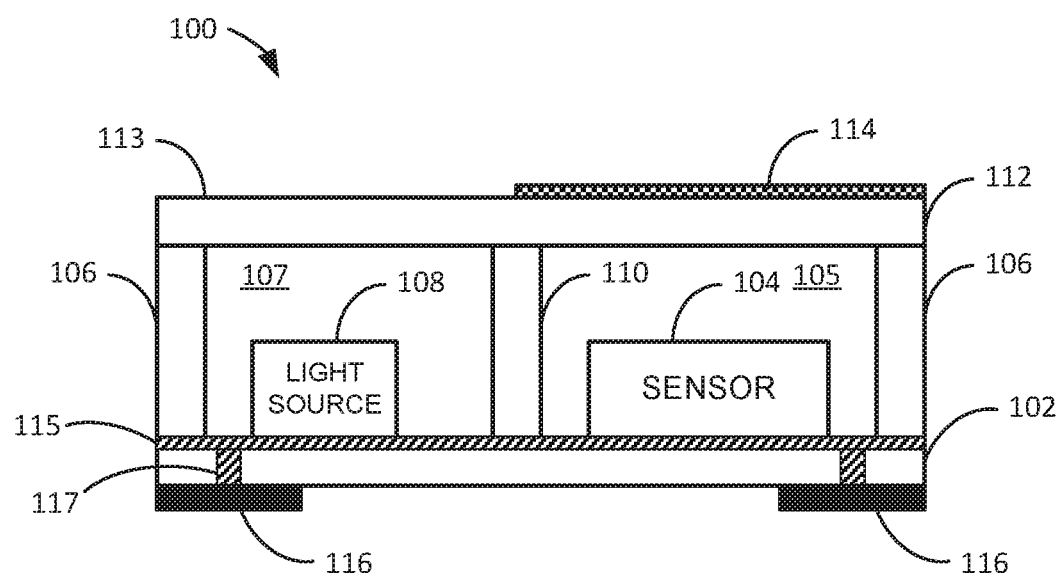
FIG. 2B is a diagrammatic partial cross-sectional side elevation view illustration of an optical sensor package with a cloaking layer, in accordance with an example implementation of the present disclosure.

As illustrated in FIGS. 2A and 2B, the optical sensor package 100 can include at least one wall 106 disposed on the substrate 102. In implementations, the wall 106 can fabricated of the same or a similar material (e.g., a glass epoxy-based printed circuit board, ceramic) as the substrate 102. However, other (different) materials may be used. Additionally, the wall 106 can be coupled to the substrate 102 such that the wall 106 is perpendicular to the substrate 102. In one implementation, the optical sensor package 100 includes a substrate 102 with two walls 106 coupled perpendicularly to the substrate 102, with the two walls 106 and the substrate 102 at least partially defining a cavity (e.g., a box or portion of a box). Another wall 110 can be coupled to the substrate 102 (e.g., between walls 106) to at least partially define a first cavity 105 containing the sensor 104 and a second cavity 107 containing the light source 108. It is contemplated that the substrate 102 and at least one wall 106 and/or 110 may be coupled and arranged in other configurations. Although wall 106 and 110 are depicted being perpendicular or substantially perpendicular to substrate 102, the wall 106 and/or wall 110 may have a non-perpendicular orientation relative to substrate 102 and the present application is not limited to the orientations depicted in the figures of the drawings. In some examples, the wall 106 and/or wall 110 may have a non-planar profile, such as an arcuate profile, a sloped profile, or a non-uniform thickness.

The optical sensor package 100 can include a cover layer 112 disposed upon and supported by one or more of the walls 106 and/or 110. The cover layer 112 is configured to allow light to reach the sensor 104. The cover layer 112 can also be configured to protect the sensor 104 from atmospheric contaminants (e.g., dust, moisture, etc.). The cover layer 112 includes a layer of glass or any other light transmissive material (e.g., silicon, quartz, sapphire, etc.). In implementations, the cover layer 112 can include a singulated portion of a glass sheet that is transparent to a variety of light and/or energy wavelengths (e.g., visible light (e.g., 400 to 800 nm wavelengths), ultraviolet light (e.g., 10 to 400 nm wavelengths), infrared light (e.g., 800 nm to 1 mm wavelengths), and so forth). The cover layer 112 can be coupled to one or more of the walls 106 and/or wall 110 using a variety of methods, such as using an adhesive or glue, for example. In one example, the cover layer 112 can include an alkali-free flat glass using a down-draw method between about 0.03 millimeters and about 1.1 millimeters in thickness. In another example, the cover layer 112 can include a clear borosilicate glass with a high chemical resistance between about 0.03 millimeters and about 1.1 millimeters in thickness. It is contemplated that the cover layer 112 may include a variety of other configurations and/or materials (e.g., silicon, quartz, sapphire, etc.). In some examples, the cover layer 112 may include a non-planar profile (e.g., and arcuate profile, a sloped profile, a non-uniform thickness).

The sensor 104 can include an optical sensor (e.g., a photodiode, a thermopile). In some implementations, the sensor 104 can include other sensor types, such as an image capture device (e.g., a camera), a gas/particle sensor (e.g., a chemical sensor), any combination of sensor types, and so forth. In an implementation, the sensor 104 can include an optical sensor having an active portion that can detect light and/or infrared radiation that passes through the cover layer 112. The sensor 104 can be optically isolated from the light source 108 by wall 110. In some implementations, the optical sensor package 100 may include multiple sensor 104 dies. In implementations, the sensor 104 includes an application specific integrated circuit (ASIC) having an integrated sensor (e.g., an integrated optical sensor). In the case where the sensor 104 includes an optical sensor, the active portion of the sensor 104 can be disposed facing the cover layer 112. The sensor 104 can be placed on the substrate 102 using, for example, pick-and-place techniques.

In some implementations, the optical sensor package 100 includes a light source 108 disposed on the substrate 102. The light source 108 can also include a light-emitting diode (LED) or a vertical-cavity surface-emitting laser. For example, the light source 108 can include a laser, a LED, an infrared LED or other light source for calibrating the sensor 104 or performing reflectance based measurements (e.g., biometric measurements and/or physiological measurements (e.g., heart rate, pulse, or plethysmographic measurements), fingerprint recognition, color or shade detection, surface characterization, and so forth). In some implementations, the cover layer 112 has an index of refraction matched or substantially matched to an index of refraction of human skin and/or other human tissue to facilitate improved biometric and/or physiological measurements. It is contemplated that the light source 108 may include other types of sources of light. In one specific implementation, the light source 108 includes an LED that emits light where the light is transmitted through the cover layer 112 to an external object (e.g., human skin or other tissue). The light source 108 can be electrically and/or mechanically coupled to the substrate and/or the sensor 104. It is contemplated that the optical sensor package 100 can include multiple light sources 108, or no light sources (e.g., as shown in FIGS. 7 through 10). In some examples, multiple light sources 108 may be configured to emit light at wavelengths that are substantially the same or at different wavelengths.

The substrate 102 can also have connectors 116 (e.g., electrically conductive connectors) disposed upon a lower surface of the substrate 102 (e.g., a surface opposite the surface on which the sensor 104 is disposed). For example, the connectors 116 can include contact pads, connector pins, solder balls, female connector sockets, any combination of the foregoing connectors, and so forth. In some implementations, a redistribution layer 115 is disposed upon the substrate 102 to establish connections (e.g., electrically conductive connections) between sensor 104 pins and light source 108 pins and the connectors 116 on the lower surface of the substrate 102. For example, vias 117 (e.g., through substrate vias) can connect the redistribution layer 115 to the connectors 116, thereby forming connections between the electrical components (e.g., sensor 104, light source 108, etc.) and the connectors 116 In some implementations, the connectors 116 are located at the sides of the optical sensor package 100 instead of or in addition to the lower surface of the substrate 102.

In an implementation, a device (e.g., mobile device 200) that includes the optical sensor package 100 can include a device (e.g., a smartphone, a biometric device, and the like) that measures vital signs, such as heart rate measurements, pulse wave velocity measurements that approximate blood pressure, and/or blood oxygen (e.g., a pulse oximeter). In another implementation, a device (e.g., mobile device 200) that includes the optical sensor package 100 can include a device (e.g., a smartphone, a digital camera, and the like) that minimizes flicker from an external source (e.g., a light source emitting a 60 hertz signal). In another implementation, a device (e.g., mobile device 200) that includes the optical sensor package 100 can include a device (e.g., a smartphone, a digital camera, and so forth) that provides white balance (e.g., extra input wavelength sources for automatic white balancing). In another implementation, a device (e.g., mobile device 200) that includes the optical sensor package 100 can include a selfie button for image capture where a user places a finger on/over the optical sensor package 100 to capture a digital image. It is contemplated that the device (e.g., mobile device 200) that includes the optical sensor package 100 can include other configurations, form factors, and/or functions.

The optical sensor package 100 includes a cloaking layer 114 disposed upon the cover layer 112. In an implementation shown in FIG. 2A, the cloaking layer 114 is disposed upon an outer surface 113 of the cover layer 112 (i.e., the surface of the cover layer 112 that faces outwardly, e.g., away from the sensor 104). For example, the cloaking layer 114 can cover all or most of an outer surface 113 of the cover layer 114. In some implementations, the cloaking layer 114 only covers a portion of the outer surface 113 of the cover layer 112. For example, in an implementation shown in FIG. 2B, the cloaking layer 114 only covers a portion of the outer surface 113 of the cover layer 112 that extends across a cavity (e.g., cavity 105) containing the sensor 104. In some examples, the cloaking layer 114 may conformally cover a portion of the cover layer 112 (e.g., conformally cover a portion of outer surface 113).

The cloaking layer 114 is configured to at least partially conceal (or cloak) the sensor package 100 or inner components (e.g., sensor 104 and/or light source 108) of the sensor package 100, while still allowing light to reach the sensor 104. For example, the cloaking layer 114 can at least partially hide or obscure the optical sensor package from view by the naked eye. In this regard, the cloaking layer 114 is transmissive to at least one light spectrum (e.g., UV light, visible light, infrared light, or at least one range of wavelengths from any of the foregoing light spectrums or a combination thereof). In an implementation, the cloaking layer 114 is transmissive to UV light or infrared light, or a combination thereof, but non-transmissive to visible light. In another implementation, the cloaking layer 114 can be transmissive to a portion of the visible light spectrum and non-transmissive to another portion of the visible light spectrum. For example, the cloaking layer 114 can be transmissive to red (620 to 750 nm), orange (590 to 620 nm), yellow (570 to 590 nm), and green (495 to 570 nm) wavelengths of light; yet, the cloaking layer 114 may be non-transmissive to blue (450-495 nm) and/or violet (380 to 450 nm) wavelengths of light. The foregoing example is provided for explanatory purposes; however, it is to be understood that the cloaking layer 114 can be configured to be transmissive to any range of light spectra and non-transmissive to another range of light spectra, such that the cloaking layer at least partially conceals or obscures the sensor package 100 or inner components of the sensor package 100 from the naked eye while still allowing at least a portion of a light spectrum to reach the sensor 104. In some implementations, the cloaking layer 114 can be partially transmissive a light spectrum. For example, the cloaking layer 114 can absorb or diffuse a portion of light and transmit a portion of light, thereby causing the cloaking layer 114 to have limited transparency such that the sensor 104 is not totally concealed but cannot be easily seen by the naked eye.

FIGS. 3A through 3D show various implementations of the cloaking layer 114. In an implementation shown in FIG. 3A, the cloaking layer 114 includes a solid ink layer 118. The solid ink layer 118 can include ink disposed upon (e.g., printed or otherwise transferred onto) the cover layer 112. The solid ink layer 118 can be any desired color. For example, the solid ink layer 118 can be a black ink layer, a white ink layer, a gray ink layer, a violet ink layer, a blue ink layer, a red ink layer, silver ink layer, a gold ink layer, or any other color. In some implementations, the solid ink layer 118 includes an ink that matches or substantially matches (e.g., is the same or similar to) a color of a portion of a device (e.g., matched or substantially matched to a color of a front or rear portion of the mobile device 200) in which the optical sensor package 100 is located. In some implementations, the solid ink layer 118 includes an ink that is complementary to a color of a portion of a device (e.g., matched or substantially matched to a color of a trim along a front or rear portion of the mobile device 200).

Figure 3A:
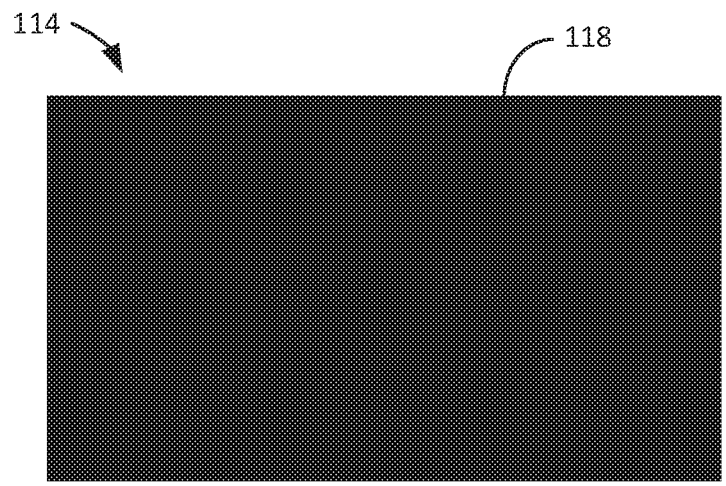
FIG. 3A is a diagrammatic top view illustration of a cloaking layer of an optical sensor package, such as the optical sensor packages illustrated in FIGS. 2A and 2B, in accordance with an example implementation of the present disclosure, wherein the cloaking layer includes a solid ink layer.
Figure 3B:
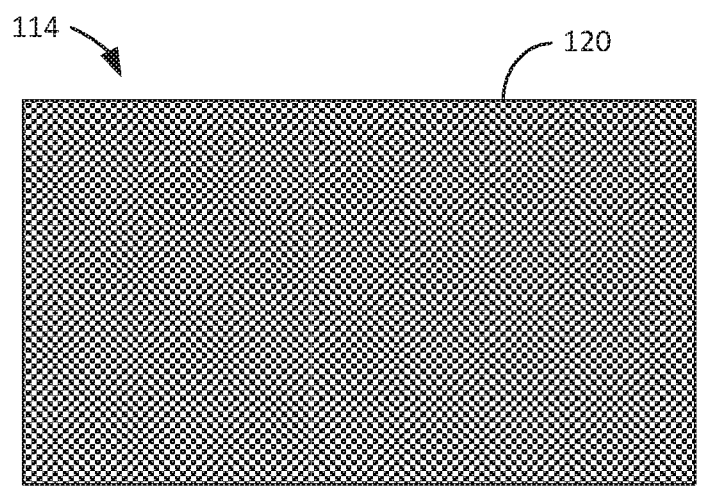
FIG. 3B is a diagrammatic top view illustration of a cloaking layer of an optical sensor package, such as the optical sensor packages illustrated in FIGS. 2A and 2B, in accordance with an example implementation of the present disclosure, wherein the cloaking layer includes a patterned ink layer.

In an implementation shown in FIG. 3B, the cloaking layer 114 includes a patterned ink layer 120. The patterned ink layer 120 can include ink disposed upon (e.g., printed or otherwise transferred onto) the cover layer 112 in virtually any desired pattern that at least partially conceals the sensor 104 while still allowing light to reach the sensor 104. Examples include a hatch pattern, a dot pattern, a diamond pattern, a horizontal line patter, a vertical line pattern, a diagonal light pattern, a grid pattern, any combination of the foregoing, and so forth. Moreover, the patterned ink layer 120 can include a black ink layer, a white ink layer, a gray ink layer, a violet ink layer, a blue ink layer, a red ink layer, silver ink layer, a gold ink layer, or any other color. In some implementations, the patterned ink layer 120 includes an ink that matches or substantially matches (e.g., is the same or similar to) a color of a portion of a device (e.g., matched or substantially matched to a color of a front or rear portion of the mobile device 200). In some implementations, the patterned ink layer 120 includes an ink that is complementary to a color of a portion of a device (e.g., matched or substantially matched to a color of a trim along a front or rear portion of the mobile device 200).

Figure 3C:
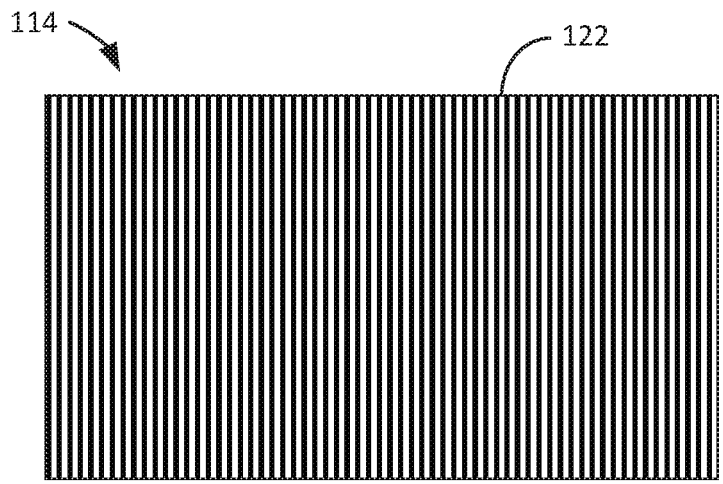
FIG. 3C is a diagrammatic top view illustration of a cloaking layer of an optical sensor package, such as the optical sensor packages illustrated in FIGS. 2A and 2B, in accordance with an example implementation of the present disclosure, wherein the cloaking layer includes a patterned metal layer.

In an implementation shown in FIG. 3C, the cloaking layer 114 includes a patterned metal layer 122. The patterned metal layer 122 can include a metal disposed upon (e.g., printed, etched, or sputtered onto) the cover layer 112 in a hatch pattern, a dot pattern, a diamond pattern, a horizontal line patter, a vertical line pattern, a diagonal light pattern, a grid pattern, any combination of the foregoing, or any other pattern that at least partially conceals the sensor 104 while still allowing light to reach the sensor 104. In some implementations, the patterned metal layer 122 includes a metal that is colored (e.g., painted, stained, or dyed) to match or substantially match a color of a portion of a device (e.g., matched or substantially matched to a color of a front or rear portion of the mobile device 200). In some implementations, the patterned metal layer 122 includes a metal that is colored (e.g., painted, stained, or dyed) to match or substantially match a color that is complementary to a color of a portion of a device (e.g., matched or substantially matched to a color of a trim along a front or rear portion of the mobile device 200).

Figure 3D:
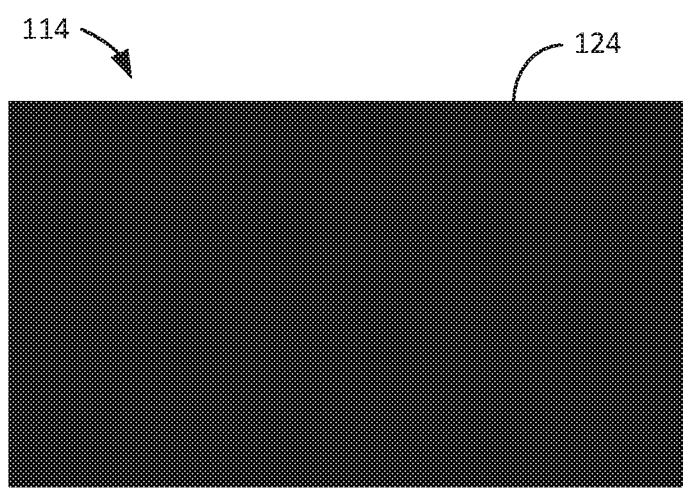
FIG. 3D is a diagrammatic top view illustration of a cloaking layer of an optical sensor package, such as the optical sensor packages illustrated in FIGS. 2A and 2B, in accordance with an example implementation of the present disclosure, wherein the cloaking layer includes a dielectric layer.

In an implementation shown in FIG. 3D, the cloaking layer 114 includes a dielectric layer 124. For example, the dielectric layer 124 can include silicon or any other dielectric material that is at least partially transmissive to at least one spectrum of light. Silicon, for example, is transmissive to wavelengths of infrared light and non-transmissive to wavelengths of visible light. In some implementations, the dielectric layer 124 includes a dielectric material that is colored (e.g., painted, stained, or dyed) to match or substantially match a color of a portion of a device (e.g., matched or substantially matched to a color of a front or rear portion of the mobile device 200). In some implementations, the dielectric layer 124 includes a dielectric material that is colored (e.g., painted, stained, or dyed) to match or substantially match a color that is complementary to a color of a portion of a device (e.g., matched or substantially matched to a color of a trim along a front or rear portion of the mobile device 200).

Figure 4A:
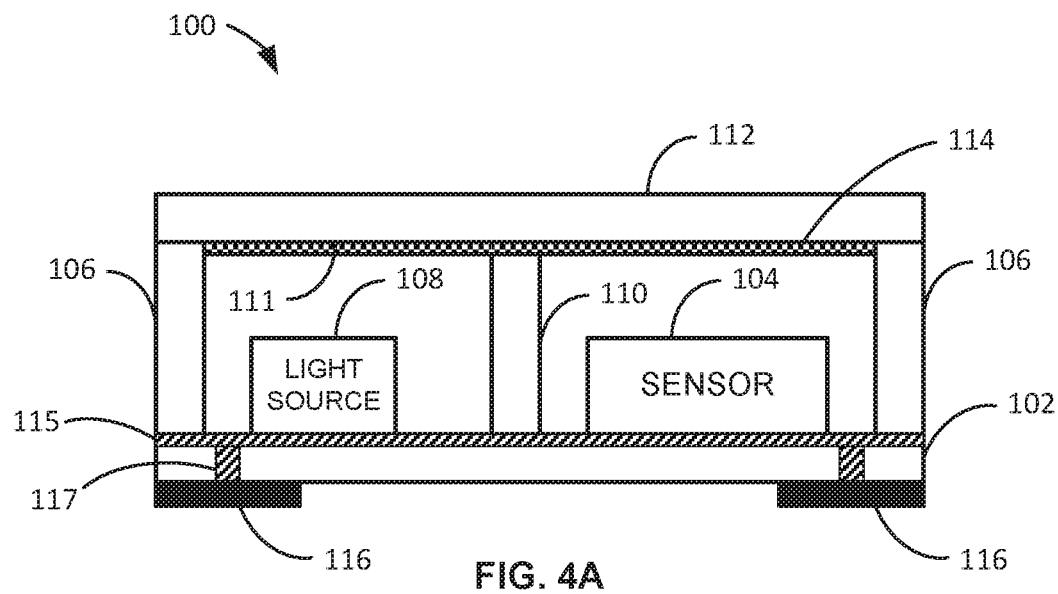
FIG. 4A is a diagrammatic partial cross-sectional side elevation view illustration of an optical sensor package with a cloaking layer, in accordance with an example implementation of the present disclosure.
Figure 4B:
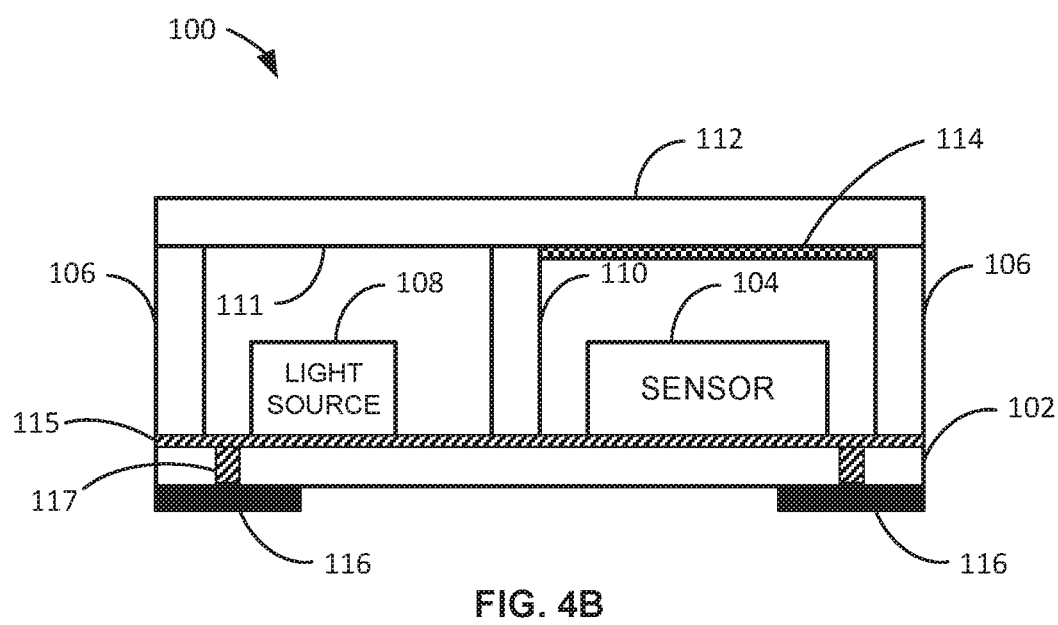
FIG. 4B is a diagrammatic partial cross-sectional side elevation view illustration of an optical sensor package with a cloaking layer, in accordance with an example implementation of the present disclosure.

In implementations shown in FIGS. 4A and 4B, the cloaking layer 114 is disposed upon an inner surface 111 of the cover layer 112 (i.e., the surface of the cover layer 112 that faces inwardly, e.g., towards the sensor 104). For example, in an implementation shown in FIG. 4A, the cloaking layer 114 can cover all or most of the inner surface 111 of the cover layer 112. In some implementations, the cloaking layer 114 only covers a portion of the inner surface 111 of the cover layer 112. For example, in an implementation shown in FIG. 4B, the cloaking layer 114 only covers a portion of the inner surface 111 of the cover layer 112 that extends across a cavity (e.g., cavity 105) containing the sensor 104.

Figure 5A:
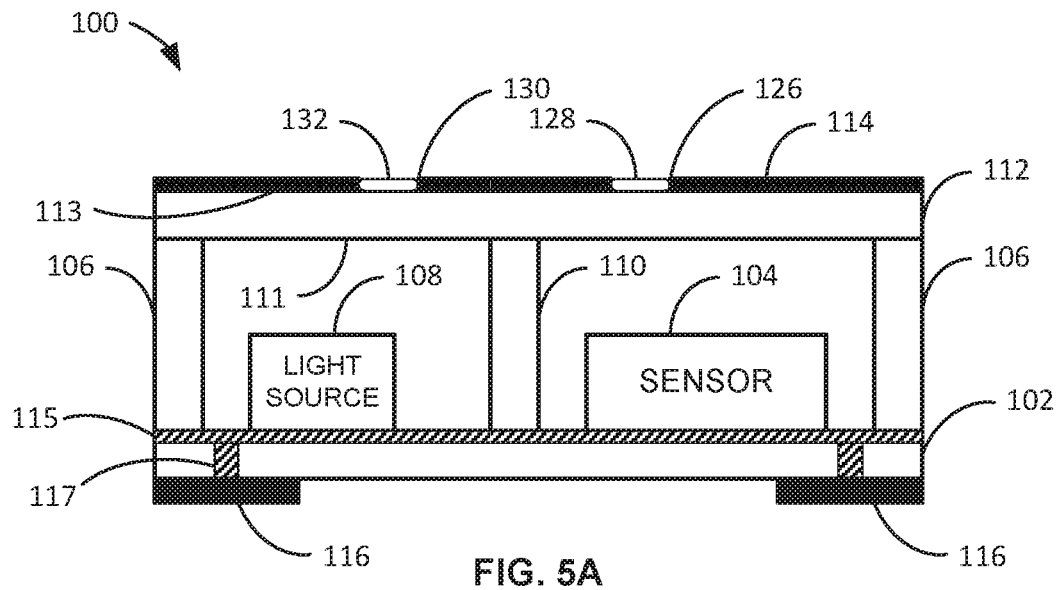
FIG. 5A is a diagrammatic partial cross-sectional side elevation view illustration of an optical sensor package with a cloaking layer, in accordance with an example implementation of the present disclosure.
Figure 5B:
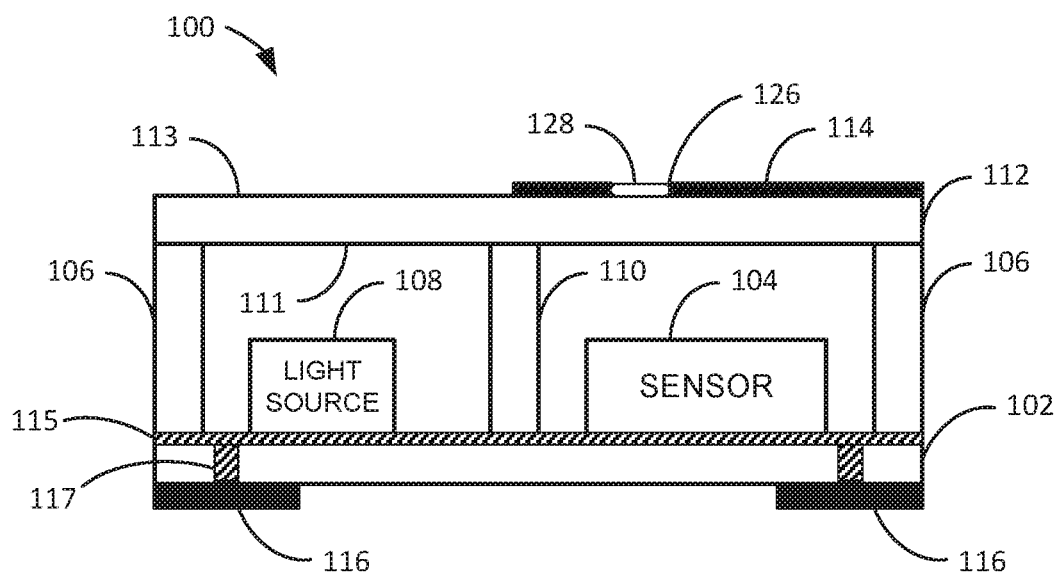
FIG. 5B is a diagrammatic partial cross-sectional side elevation view illustration of an optical sensor package with a cloaking layer, in accordance with an example implementation of the present disclosure.

In implementations shown in FIGS. 5A and 5B, the cloaking layer 114 is opaque (e.g., non-transmissive to light). For example, the cloaking layer 114 can include a metal layer, a plastic layer, a dielectric layer, a pigmented layer (e.g., paint), any combination of the foregoing, and so forth. The cloaking layer 114 can include at least one aperture 126 that is configured to allow light to reach the sensor 104. The aperture 126 can have dimensions that cause sensor 104 to be at least partially concealed in spite of the aperture 126. For example, the aperture 126 can have an area that is smaller than a surface area of the sensor 104 (e.g., an active light sensing region or area of sensor 104). In some implementations, the aperture 126 can have a lens 128 disposed within the aperture 126 or adjacent to (e.g., extending across) the aperture 126 to focus light received through the aperture 126 onto the sensor 104. In some implementations, the cloaking layer 114 only covers a portion of a surface (e.g., the inner surface 111 or the outer surface 113) of the cover layer 112. For example, in an implementation shown in FIG. 5B, the cloaking layer 114 only covers a portion of the outer surface 113 of the cover layer 112 that extends across a cavity (e.g., cavity 105) containing the sensor 104. In an implementation shown in FIG. 5A, where the cloaking layer 114 covers all or most of the cover layer 112, the cloaking layer 114 can include at least one additional aperture 130 that is configured to allow light from light source 108 to pass through the cloaking layer 114. In some implementations, aperture 130 can have a respective lens 132 disposed within the aperture 130 or adjacent to (e.g., extending across) the aperture 132 to focus light from light source 108 along a transmission path (e.g., along a transmission path to an object such as human skin or other tissue).

Figure 6A:
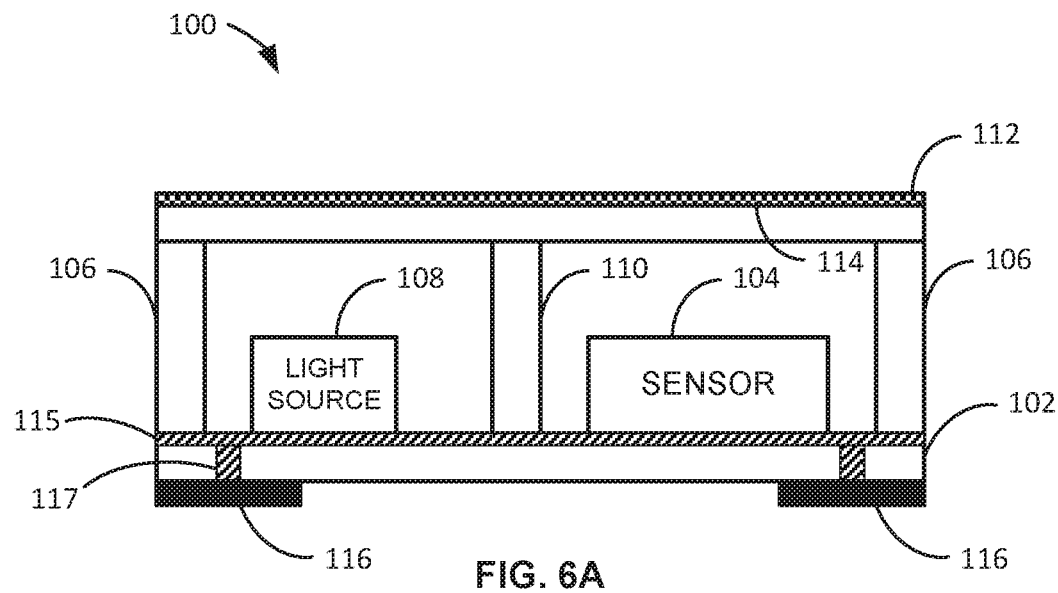
FIG. 6A is a diagrammatic partial cross-sectional side elevation view illustration of an optical sensor package with a cloaking layer, in accordance with an example implementation of the present disclosure.
Figure 6B:
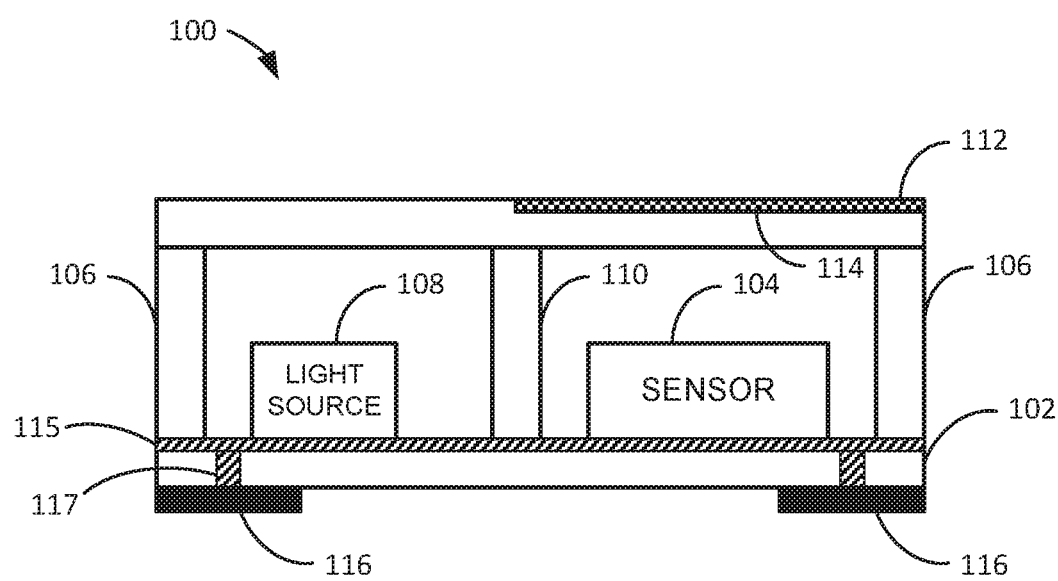
FIG. 6B is a diagrammatic partial cross-sectional side elevation view illustration of an optical sensor package with a cloaking layer, in accordance with an example implementation of the present disclosure.

In implementations shown in FIGS. 6A and 6B, the cloaking layer 114 may include a processed surface of the cover layer 112. For example, in an implementation, the cloaking layer 114 is formed by etching at least a portion of a surface (e.g., an upper surface, a lower surface) of the cover layer 112. In another implementation the cloaking layer 114 is formed by additive deposition (e.g., 3D printing or sputtering) on at least a portion of a surface of the cover layer 112. In an implementation (e.g., as shown in FIG. 6A), the cloaking layer 114 is formed by processing all or most of an upper or a lower surface of the cover layer 114. In some implementations, the cloaking layer 114 is formed by processing only a portion of the upper or the lower surface of the cover layer 112. For example, in an implementation shown in FIG. 6B, the cloaking layer 114 is formed by processing a portion of the outer surface 113 of the cover layer 112 that extends across a cavity (e.g., cavity 105) containing the sensor 104.

Figure 7:
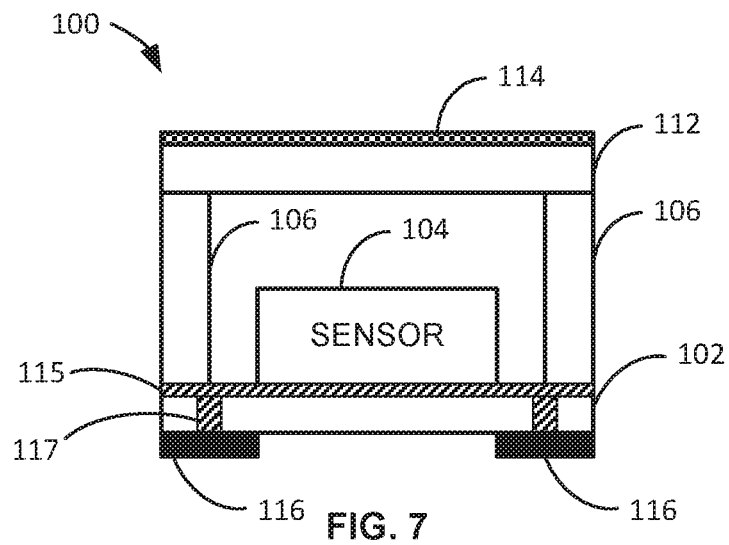
FIG. 7 is a diagrammatic partial cross-sectional side elevation view illustration of an optical sensor package with a cloaking layer, in accordance with an example implementation of the present disclosure.
Figure 8:
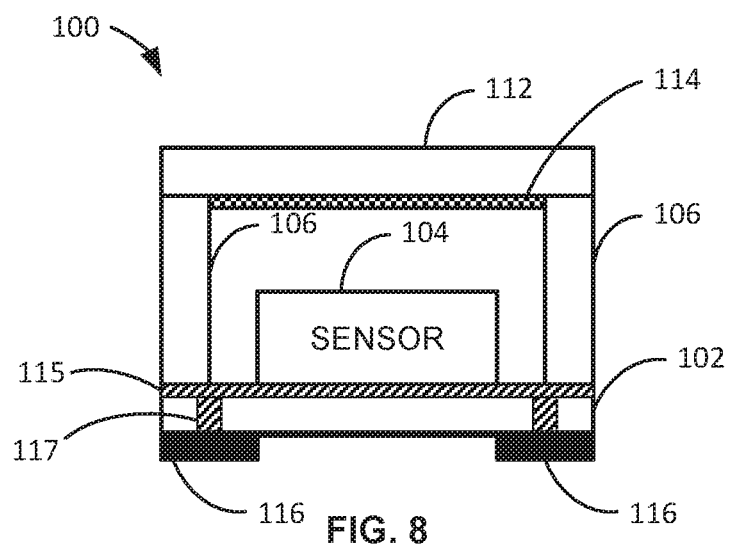
FIG. 8 is a diagrammatic partial cross-sectional side elevation view illustration of an optical sensor package with a cloaking layer, in accordance with an example implementation of the present disclosure.
Figure 9:
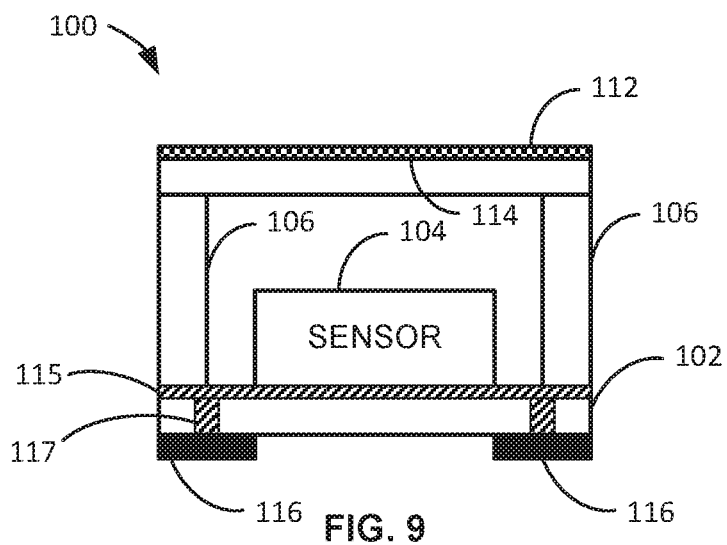
FIG. 9 is a diagrammatic partial cross-sectional side elevation view illustration of an optical sensor package with a cloaking layer, in accordance with an example implementation of the present disclosure.
Figure 10:
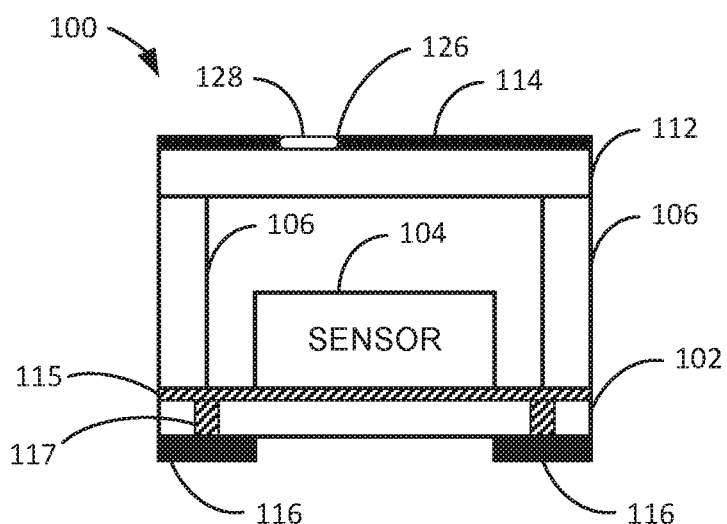
FIG. 10 is a diagrammatic partial cross-sectional side elevation view illustration of an optical sensor package with a cloaking layer, in accordance with an example implementation of the present disclosure.

FIGS. 7 through 10 show implementations of the optical sensor package 100 without light source 108. For example, FIG. 7 shows an implementation where the cloaking layer 114 is disposed upon an outer surface 113 of (e.g., above) the cover layer 112. FIG. 8 shows an implementation where the cloaking layer 114 is disposed upon an inner surface 111 of (e.g., below) the cover layer 112. FIG. 9 shows an implementation where the cloaking layer 114 is formed by processing (e.g., etching or performing additive deposition on) a surface of the cover layer 112. FIG. 10 shows an implementation where the cloaking layer 114 is opaque and includes an aperture 126 that allows light transmitted through the aperture 126 to reach the sensor 104. In some implementations, the aperture 126 can have a lens 128 disposed within the aperture 126 or adjacent to (e.g., extending across) the aperture 126 to focus light received through the aperture 126 onto the sensor 104. It is to be understood that while implementations of an optical sensor package 100 including one sensor 104 and some implementations of the optical sensor package 100 further including one light source 108 have been shown and described herein, the optical sensor package 100 can include any number of sensors 104 and any number of light sources 108 without departing from the scope of this disclosure.

In the implementation shown in FIGS. 1A and 1B, a mobile device 200 includes an optical sensor package 100 having a cloaking layer 114. Some examples of a mobile device 200 can include a wearable device, a portable device, such as a tablet computer, a smartphone, a global positioning (GPS) device, and/or a digital media player. Additionally, the mobile device 200 can include capability for Wi-Fi, Bluetooth, Bluetooth Lowe Energy, and/or near field communication (NFC). In these implementations, the optical sensor package 100 may be disposed proximate to a camera 202 and/or other component of the mobile device 200. FIG. 1A illustrates a front view of an exemplary mobile device 200 having a screen 204 and a control button 206. FIG. 1B illustrates a rear view (e.g., opposite the front view) having an optical sensor package 100. Using an optical sensor package 100 with a cloaking layer 114 in a device (e.g., the mobile device 200) provides for a more aesthetically pleasing look because the cloaking layer 114 hides the optical sensor package 100 and/or the inner components (e.g., sensor 104 and/or light source 108) of the optical sensor package 100.

In an implementation, a mobile device 200 and an optical sensor package 100 having a cloaking layer 114 can match or substantially match the color of the cloaking layer 114 with the color of the outside surface of the mobile device 200 or other device. For example, if the outside surface of the mobile device 200 is black, the color of the cloaking layer 114 can be black or substantially black. Matching or substantially matching the color of the cloaking layer 114 with the color of the surface of the mobile device 200 or other device, provides a more aesthetically pleasing look by obscuring the optical sensor package 100 from view. It is contemplated that the cloaking layer 114 may include a variety of colors. Some examples of cloaking layer 114 colors can include blue, red, yellow, green, cyan, gray, silver, gold, white, slate, rose gold, pink, violet, or a combination of colors.

In some implementations, the optical sensor package 100 can include the cloaking layer 114 for concealing the sensor 104 without the cover layer 112. For example, the cloaking layer 114 can serve to at least partially conceal the sensor 104 and protect the sensor 104 from atmospheric contaminants (e.g., dust, moisture, etc.). In other implementations, the cloaking layer 114 can be located in a structure separate from the optical sensor package 100. For example, the cloaking layer 114 can form a portion of a device (e.g., the mobile device 200), such as an outer body portion of the mobile device 200. In other implementations, the cloaking layer 114 can be part of a device accessory (e.g., a mobile device cover 300).

Figure 12:
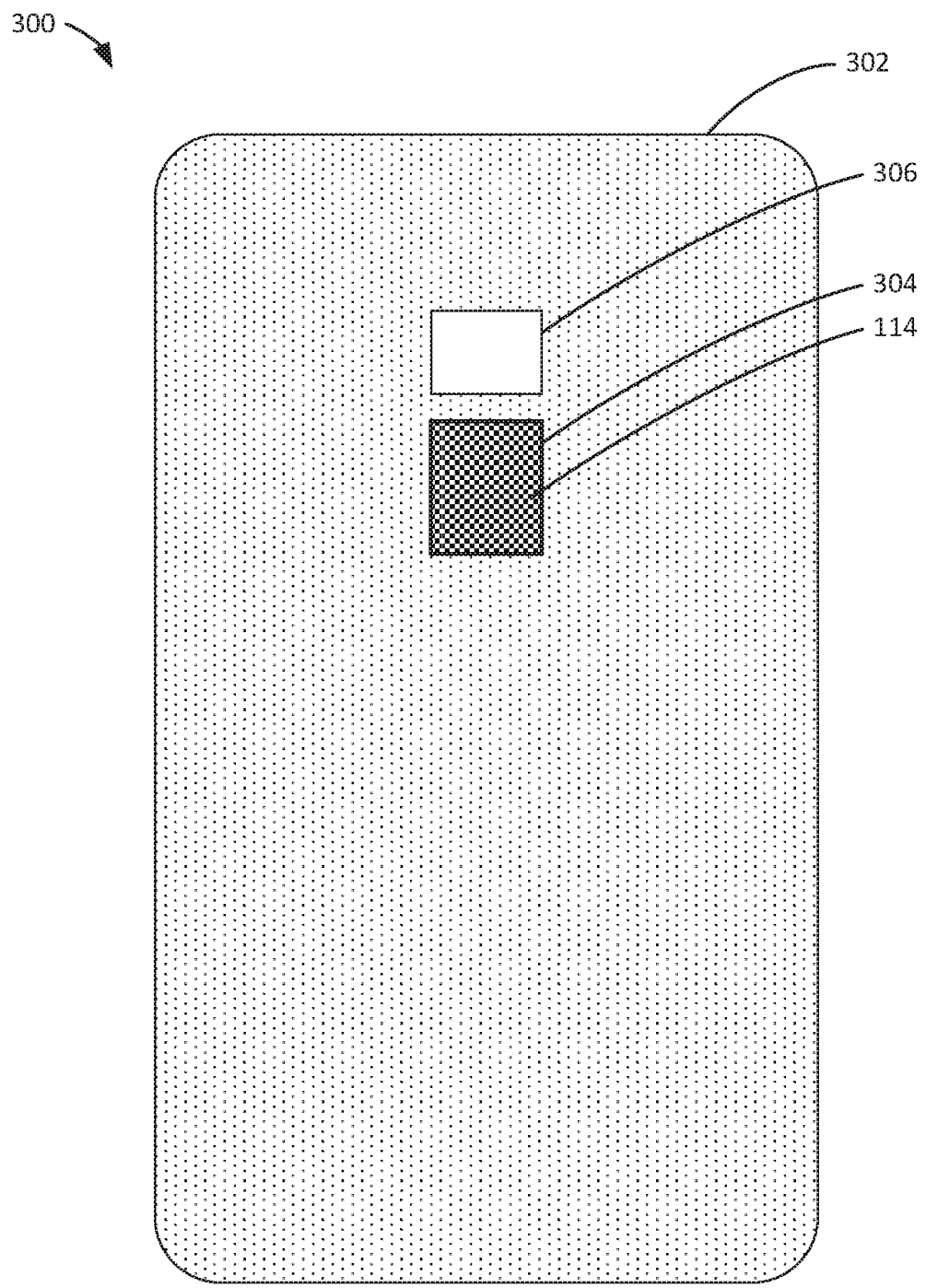
FIG. 12 is a side elevation view illustration of an implementation of a mobile device cover with a cloaking layer that aligns with an optical sensor package of a mobile device, such as the mobile device illustrated in FIGS. 1A and 1B, in accordance with an example implementation of the present disclosure.

FIG. 12 shows an implementation of a mobile device cover 300 that includes a cloaking layer 114. The mobile device cover 300 can include a casing material 302 (e.g., a plastic or rubber shell) configured to at least partially cover a mobile device, such as the mobile device 200 shown in FIGS. 1A and 1B. The casing material 302 can include an aperture 304 configured to align with a sensor (e.g., sensor 104) of the mobile device 200. In some implementations, the mobile device cover 300 further includes an aperture 306 that is configured to align with a camera 202 or other system of the mobile device. The aperture 304 can have the cloaking layer 114 disposed within or adjacent to the aperture 304. For example, the cloaking layer 114 can be deployed as an insert placed within or across aperture 304. In some implementations, the cloaking layer 114 can be disposed upon or formed on a surface of cover layer that is disposed within or adjacent to the aperture 304.

Figure 11:
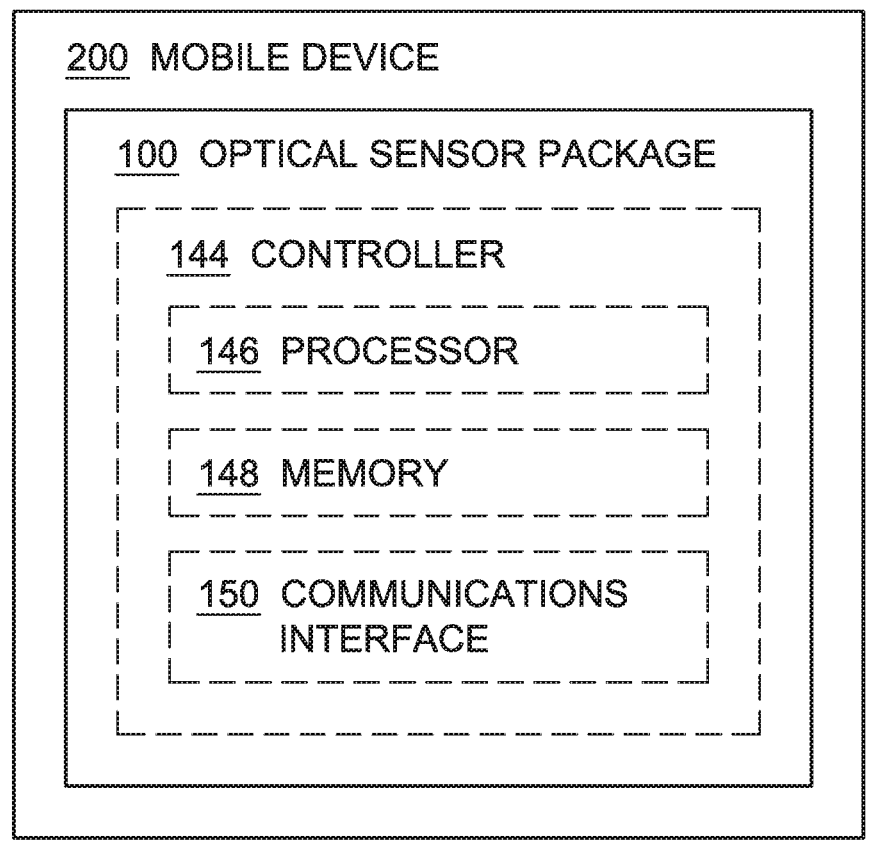
FIG. 11 is a diagrammatic view illustration of a mobile device having an optical sensor package with a cloaking layer, in accordance with an example implementation of the present disclosure.

As shown in FIG. 11, optical sensor package 100 can include a controller 144. For example, the controller 144 can include sensor 104, where sensor 104 includes an ASIC. In another implementation, the controller 144 can include an ASIC separate from sensor 104, that is coupled to substrate 102. The optical sensor package 100, including some or all of its components, can operate under computer control. For example, a processor 146 can be included with or in an optical sensor package 100 and/or controller 144 to control the components and functions of the optical sensor package 100 described herein using software, hardware, firmware (e.g., fixed logic circuitry), manual processing, or a combination thereof. The terms "controller," "functionality," "service," and "logic" as used herein generally represent software, firmware, hardware, or a combination of software, firmware, or hardware in conjunction with controlling the optical sensor package 100. In the case of a software implementation, the module, functionality, or logic represents program code (e.g., algorithms embodied in a non-transitory computer readable medium) that performs specified tasks when executed on a processor (e.g., central processing unit (CPU) or CPUs). The program code can be stored in one or more non-transitory computer-readable memory devices or media (e.g., internal memory and/or one or more tangible media), and so on. For example, memory may include but is not limited to volatile memory, non-volatile memory, Flash memory, SRAM, DRAM, RAM and ROM. The structures, functions, approaches, and techniques described herein can be implemented on a variety of commercial computing platforms having a variety of processors.

As illustrated in FIG. 11, the controller 144 can include a processor 146, a memory 148, and a communications interface 150. The processor 146 provides processing functionality for at least the optical sensor package 100/controller 144 and can include any number of processors, microcontrollers, circuitry, field programmable gate array (FPGA) or other processing systems, and resident or external memory for storing data, executable code, and other information accessed or generated by the optical sensor package 100/controller 144. The processor 146 can execute one or more software programs embodied in a non-transitory computer readable medium that implement techniques described herein. The processor 146 is not limited by the materials from which it is formed, or the processing mechanisms employed therein and, as such, can be implemented via semiconductor(s) and/or transistors (e.g., using electronic integrated circuit (IC) components), and so forth.

The controller 144 may include a memory 148 (e.g., Flash memory, RAM, SRAM, DRAM, ROM, etc.). The memory 148 can be an example of tangible, computer-readable storage medium that provides storage functionality to store various data and or program code associated with operation of the optical sensor package 100/controller 144, such as software programs and/or code segments, or other data to instruct the processor 146, and possibly other components of the optical sensor package 100/controller 144, to perform the functionality described herein. Thus, the memory 148 can store data, such as a program of instructions for operating the optical sensor package 100 (including its components), and so forth. It should be noted that while a single memory 148 is described, a wide variety of types and combinations of memory (e.g., tangible, non-transitory memory) can be employed. The memory 148 can be integral with the processor 146, can comprise stand-alone memory, or can be a combination of both.

Some examples of the memory 148 can include removable and non-removable memory components, such as random-access memory (RAM), read-only memory (ROM), flash memory (e.g., a secure digital (SD) memory card, a mini-SD memory card, and/or a micro-SD memory card), magnetic memory, optical memory, universal serial bus (USB) memory devices, hard disk memory, external memory, and so forth. In implementations, the optical sensor package 100 and/or the memory 148 can include removable integrated circuit card (ICC) memory, such as memory provided by a subscriber identity module (SIM) card, a universal subscriber identity module (USIM) card, a universal integrated circuit card (UICC), and so on.

The controller 144 may include a communications interface 150. The communications interface 150 can be operatively configured to communicate with components of the optical sensor package 100. For example, the communications interface 150 can be configured to transmit data for storage in the optical sensor package 100, retrieve data from storage in the optical sensor package 100, and so forth. The communications interface 150 can also be communicatively coupled with the processor 146 to facilitate data transfer between components of the optical sensor package 100 and the processor 146 (e.g., for communicating inputs to the processor 146 received from a device communicatively coupled with the optical sensor package 100/controller 144). It should be noted that while the communications interface 150 is described as a component of an optical sensor package 100/controller 144, one or more components of the communications interface 150 can be implemented as external components communicatively coupled to the optical sensor package 100 via a wired and/or wireless connection. The optical sensor package 100 can also include and/or connect to one or more input/output (I/O) devices (e.g., via the communications interface 150), such as a display, a mouse, a touchpad, a touchscreen, a keyboard, a microphone (e.g., for voice commands) and so on.

The communications interface 150 and/or the processor 146 can be configured to communicate with a variety of different networks, such as a wide-area cellular telephone network, such as a cellular network, a 3G cellular network, a 4G cellular network, or a global system for mobile communications (GSM) network; a wireless computer communications network, such as a WiFi network (e.g., a wireless local area network (WLAN) operated using IEEE 802.11 network standards); an ad-hoc wireless network, an internet; the Internet; a wide area network (WAN); a local area network (LAN); a personal area network (PAN) (e.g., a wireless personal area network (WPAN) operated using IEEE 802.15 network standards); a public telephone network; an extranet; an intranet; and so on. However, this list is provided by way of example only and is not meant to limit the present disclosure. Further, the communications interface 150 can be configured to communicate with a single network or multiple networks across different access points. In a specific implementation, a communications interface 150 can transmit information from the controller 144 to an external device (e.g., a cell phone, a computer connected to a WiFi network, cloud storage, etc.). In another specific implementation, a communications interface 150 can receive information from an external device (e.g., a cell phone, a computer connected to a WiFi network, cloud storage, etc.).

Generally, any of the functions described herein can be implemented using hardware (e.g., fixed logic circuitry such as integrated circuits), software, firmware, manual processing, or a combination thereof. Thus, the blocks discussed in the above disclosure generally represent hardware (e.g., fixed logic circuitry such as integrated circuits), software, firmware, or a combination thereof. In the instance of a hardware configuration, the various blocks discussed in the above disclosure may be implemented as integrated circuits along with other functionality. Such integrated circuits may include all of the functions of a given block, system, or circuit, or a portion of the functions of the block, system, or circuit. Further, elements of the blocks, systems, or circuits may be implemented across multiple integrated circuits. Such integrated circuits may comprise various integrated circuits, including, but not necessarily limited to: a monolithic integrated circuit, a flip chip integrated circuit, a multichip module integrated circuit, and/or a mixed signal integrated circuit. In the instance of a software implementation, the various blocks discussed in the above disclosure represent executable instructions (e.g., program code) that perform specified tasks when executed on a processor. These executable instructions can be stored in one or more tangible computer readable media. In some such instances, the entire system, block, or circuit may be implemented using its software or firmware equivalent. In other instances, one part of a given system, block, or circuit may be implemented in software or firmware, while other parts are implemented in hardware.

FIGS. 15 through 17 illustrate additional implementations of an optical sensor package including a cloaking device which includes a switchable layer. Many of the components discussed in this disclosure with respect to other implementations may be present in the implementations shown in FIGS. 15-17 and many of the components may have the same or similar features as those discussed and described with respect to other implementations.

The optical sensor package shown in FIGS. 15 through 17 includes a substrate, at least one wall disposed on the substrate, at least one glass layer disposed on the at least one wall, where the substrate, the at least one wall, and the at least one glass layer define a first cavity and a second cavity. In this implementation, an application specific integrated circuit is disposed on the substrate and in the first cavity, and a light source is disposed on the substrate and in the second cavity. A switchable layer is disposed proximate to (e.g., on or near) the glass layer. In another implementation, a device includes a mobile device including the optical sensor package previously described, where the optical sensor package includes a switchable layer disposed on the glass layer. A process for fabricating these implementations of the optical sensor package is disclosed.

Utilizing an optical sensor package having a switchable layer disposed on the glass layer provides an aesthetically pleasing device when the switchable layer, when activated, becomes opaque (e.g., darkens) and/or replicates the color of the mobile device color.

Figure 15B:
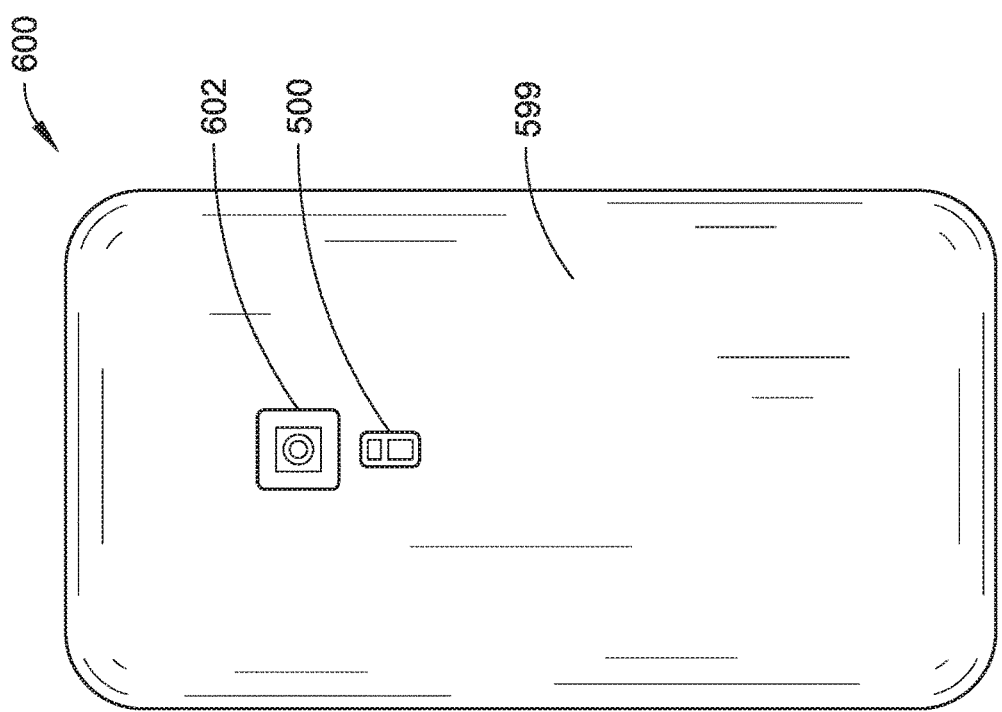
FIG. 15B is a rear view illustration of an implementation of a mobile device having an optical sensor package with a switchable layer, in accordance with an example implementation of the present disclosure.
Figure 15A:
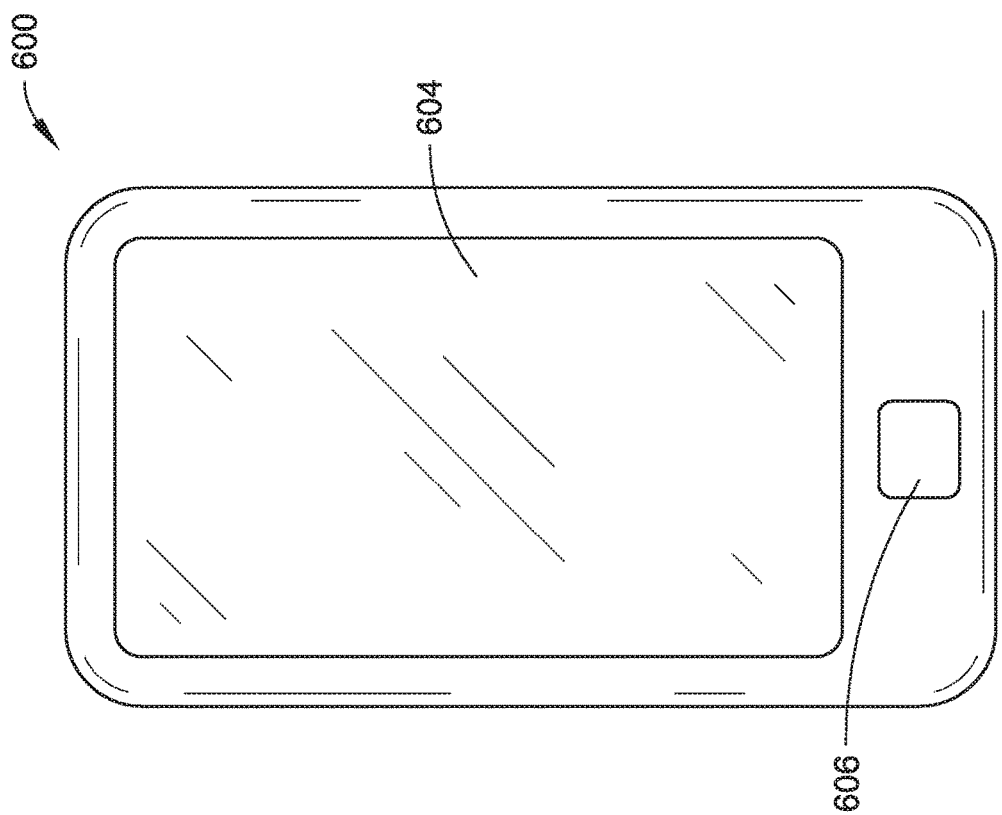
FIG. 15A is a front view illustration of an implementation of a mobile device having an optical sensor package with a switchable layer, in accordance with an example implementation of the present disclosure.

FIGS. 15 through 17 illustrate an optical sensor package 500 and a mobile device 600. The optical sensor package 500 and the mobile device 600 described herein include a switchable layer 514 configured to provide an aesthetically pleasing optical sensor package 500 while maintaining sensor functionality. FIG. 15A illustrates a front view of an exemplary mobile device 500 having a screen 604 and a control button 606. FIG. 15B illustrates a rear view (e.g., opposite the front view) having an optical sensor package 500.

In implementations, the optical sensor package 500 can include a substrate 502. In implementations, the substrate 502 can include a panel and/or a board suitable to mechanically support and electrically connect electronic components (e.g., optical sensor, light source, etc.) using conductive tracks, traces, pads, redistribution layers (e.g., a layer of wiring or conductive routing that can electrically couple to a first chip, a second chip, a contact pad, and so forth, and re-route an input/output layout), vias, and other features that may be etched from copper sheets or other electrically conductive material laminated onto a non-conductive substrate. In one implementation, the substrate 502 can be formed from a glass epoxy material (e.g., a printed circuit board), such as FR-4 glass epoxy (a composite material composed of woven fiberglass cloth with an epoxy resin binder). For example, the substrate 502 can include a portion of a printed circuit board and/or a flexible printed circuit board that has contact pads that are configured to be coupled to a light source 508 and an application specific integrated circuit 504. It is contemplated that the substrate 502 may include other materials, such as other glass epoxy, ceramic, glass, a polymer, and/or silicon. For example, the substrate 502 can include a portion of a glass panel that includes contact pads that are configured to couple to electronic devices, such as a light source 508 and an application specific integrated circuit 504. In some examples, the glass panel may be made from a flexible material. In other examples, the glass panel may have an arcuate profile.

The optical sensor package 500 can include at least one wall 506 disposed on the substrate 502. In implementations, the wall 506 can fabricated of the same or a similar material (e.g., a glass epoxy-based printed circuit board, ceramic) as the substrate 502. However, other (different) materials may be used. Additionally, the wall 506 can be coupled to the substrate 502 such that the wall 506 is perpendicular to the substrate 502. In one implementation, the optical sensor package 500 includes a substrate 502 with four walls 506 coupled perpendicularly to the substrate 502, with the four walls 506 and the substrate 502 partially defining a box. In this implementation, another wall 506 can be coupled to the substrate 502 and two other walls 506 where a first cavity 505 and a second cavity 507 are partially defined. It is contemplated that the substrate 502 and at least one wall 506 may be coupled and arranged in other configurations. Further, the at least one wall 506 and/or substrate 502 can include electrical routing and connections, such as a redistribution layer 515, contact pads, through vias, wiring, electrically conductive traces, and so forth.

The optical sensor package 500 can include a cover layer 512 disposed on the at least one wall 506. In this configuration, the cover layer 512, the at least one wall 506, and the substrate 502 define a first cavity 505 and a second cavity 507. In implementations, the cover layer 512 can include a singulated portion of a glass sheet that is transparent to a variety of light and/or energy wavelengths (e.g., visible light (e.g., 400 to 800 nm wavelengths), ultraviolet light (e.g., 10 to 400 nm wavelengths), infrared light (e.g., 800 nm to 1 mm wavelengths), and so forth). The cover layer 512 can be coupled to the at least one wall 506 using a variety of methods, such as using an adhesive. In one example, the cover layer 512 can include an alkali-free flat glass using a down-draw method between about 0.03 millimeters and about 1.1 millimeters in thickness. In another example, the cover layer 512 can include a clear borosilicate glass with a high chemical resistance between about 0.03 millimeters and about 1.1 millimeters in thickness. It is contemplated that the cover layer 512 may include a variety of other configurations and/or materials (e.g., silicon, quartz, sapphire, etc.). In some implementations, the cover layer 512 can comprise optically transparent materials other than glass, such as a polymer. Additionally, the cover layer 512 can have at least one metal connection from indium tin oxide (ITO) and/or a conductor configured to bias the cover layer 512. In some instances, the cover layer 512 may not be flush with the outside surface 599 of the mobile device 600.

In some implementations, the cover layer 512 can include at least one through-glass via 517. In these implementations, a through-glass via 517 can include a via that extends through the cover layer 512 from a redistribution layer 515 and/or an electrical connection disposed in the at least one wall 506 to a switchable layer 514. The through-glass via 517 can include a metal (e.g., copper) or other electrically conductive material for providing an electrical signal (e.g., a voltage or current). It is contemplated that the cover layer 512 can include other types of electrical connections, such as wiring and/or a metal trace from a first side of the cover layer 512 to a second side of the cover layer 512.

The optical sensor device 500 can include an application specific integrated circuit (ASIC) 512 disposed on the substrate 502 and within the first cavity 505. In implementations, the application specific integrated circuit 504 can include a sensor, such as an optical sensor (e.g., a photodiode, a thermopile). In one implementation, the application specific integrated circuit 504 can include an optical sensor having an active portion that can detect one or more wavelengths of light (e.g., visible wavelengths of light, infrared wavelengths of light, ultraviolet wavelengths of light) that passes through the cover layer 512 and the first cavity 505. The application specific integrated circuit 504 can be disposed in the first cavity 505 and can be optically isolated from the second cavity 507 (e.g., by one or more walls 506). In some implementations, the optical sensor device 500 may include multiple application specific integrated circuit 504 dies. In the case where the application specific integrated circuit 504 includes an optical sensor, the active portion of the application specific integrated circuit 504 can be disposed facing the cover layer 512 so that light passing through the cover layer 512 is incident on the optical sensor device 500. The application specific integrated circuit 504 can be placed on the substrate 502 using, for example, pick-and-place techniques. For example, solder bumps and contact pads may be used to electrically and/or mechanically couple the application specific integrated circuit 504 to the substrate 502 and associated redistribution layer 515.

Additionally, the optical sensor device 500 can include a light source 508 disposed on the substrate 502 and within the second cavity 507. Some examples of a light source 508 may include but is not limited to a light-emitting diode (LED) or a vertical-cavity surface-emitting laser, for example. It is contemplated that the light source 508 may include other types of sources of light. In one specific implementation, the light source 508 includes an LED that emits light where the light is transmitted through the cover layer 512 to an external object (e.g., a body structure such as skin tissue). The light source 508 can be electrically and/or mechanically coupled to the substrate 502 and/or the application specific integrated circuit 504. It is contemplated that the optical sensor device 500 can include multiple light sources 508. The multiple light sources may emit light having wavelengths in the visible spectrum and/or the invisible spectrum, for example.

The optical sensor package 500 can include a switchable layer 514 disposed on the cover layer 512. In implementations, the switchable layer 514 can include glass, glazing, and/or a film with light transmission properties that are altered when voltage, current, light, an electrical signal and/or heat are applied. Some examples of a switchable layer 514 material can include an electrochromic material, a photochromic material, a thermochromic material, a suspended particle material, a micro-blind, a nanocrystal material, smart glass, and/or a polymer dispersed liquid crystal material. In some implementations, the switchable layer 514 can include a conductive coating 518 configured to provide an electrical signal (e.g., a voltage) to the switchable elements (e.g., suspended particles 520, such as liquid crystals and so forth) of the switchable layer 514. In one implementation, a switchable layer 514 disposed on a cover layer 512 can be placed on the at least one wall 506 as a single unit (e.g., a lid or a cap). In one example, the switchable layer 514 can include a thermochromic material that is activated (e.g., becomes more transparent) by a user's touch and heat from the user's skin. In this example, the thermochromic material can be dark or not activated (e.g., obscured when the switchable layer 514 is exposed to an ambient temperature).

Switchable layer 514 can be topped, wholly or partially with a top glass 608, which may be made of similar materials as described for cover layer 512.

Figure 16A:
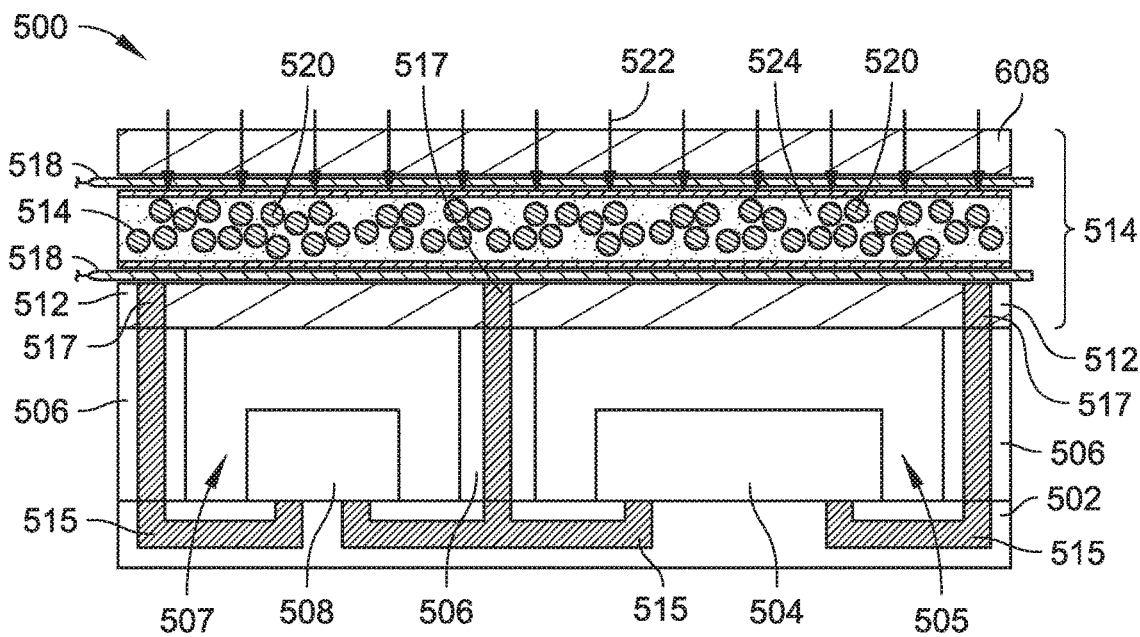
FIG. 16A is a diagrammatic partial cross-sectional side elevation view illustration of an optical sensor package with a switchable layer, in accordance with an example implementation of the present disclosure.
Figure 16B:
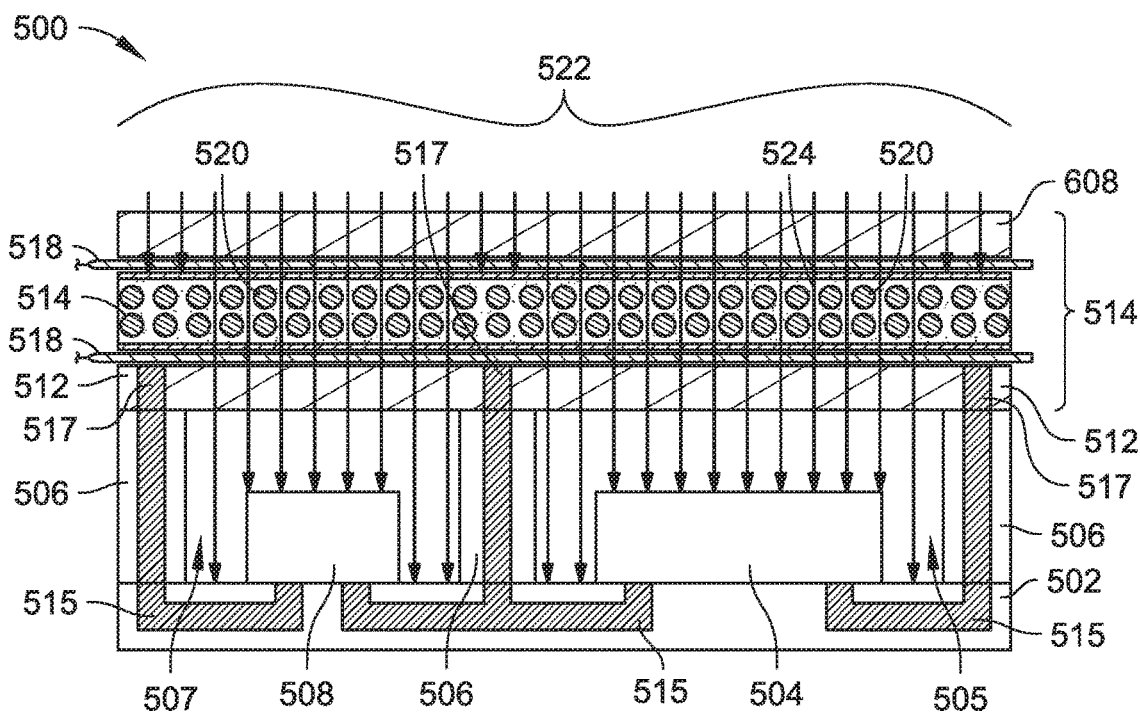
FIG. 16B is a diagrammatic partial cross-sectional side elevation view illustration of an optical sensor package with a switchable layer, in accordance with an example implementation of the present disclosure.

In the implementation illustrated in FIG. 16A, the optical sensor package 500 is shown with an electrochromic switchable layer 514 where suspended particles 520 in the switchable layer 514 are randomly disposed and block light 522 and/or energy from passing through the switchable layer 514 and the cover layer 512. In this implementation, an electrical signal (e.g., a voltage) has not been applied to the conductive coating 518 and/or the switchable layer 514. In the implementation illustrated in FIG. 16B, an optical sensor package 500 having an electrochromic switchable layer 514 is shown. In this implementation, an electrical signal (e.g., a voltage) has been applied to the conductive coating 518 and causes the suspended particles 520 within the switchable layer 514 to align and let light 522 and/or energy pass. In the implementations illustrated in FIGS. 16A and 16B, the switchable layer 514 includes a conductive coating 518

(e.g., indium tin oxide (ITO)) disposed on two distal sides of the switchable layer 514. The conductive coating 518 can be electrically coupled to at least one through-glass via 517, a redistribution layer 515, the light source 508, the application specific integrated circuit 504, and/or other electrical interconnections.

Figure 16C:
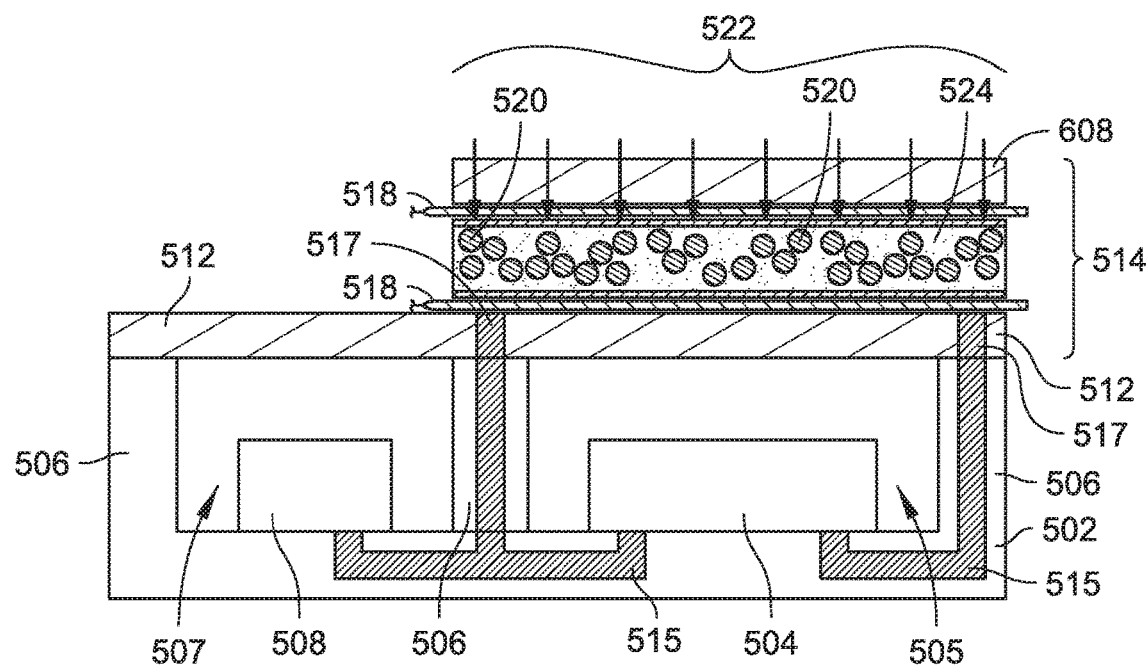
FIG. 16C is a diagrammatic partial cross-sectional side elevation view illustration of an optical sensor package with a switchable layer, in accordance with an example implementation of the present disclosure.
Figure 16D:
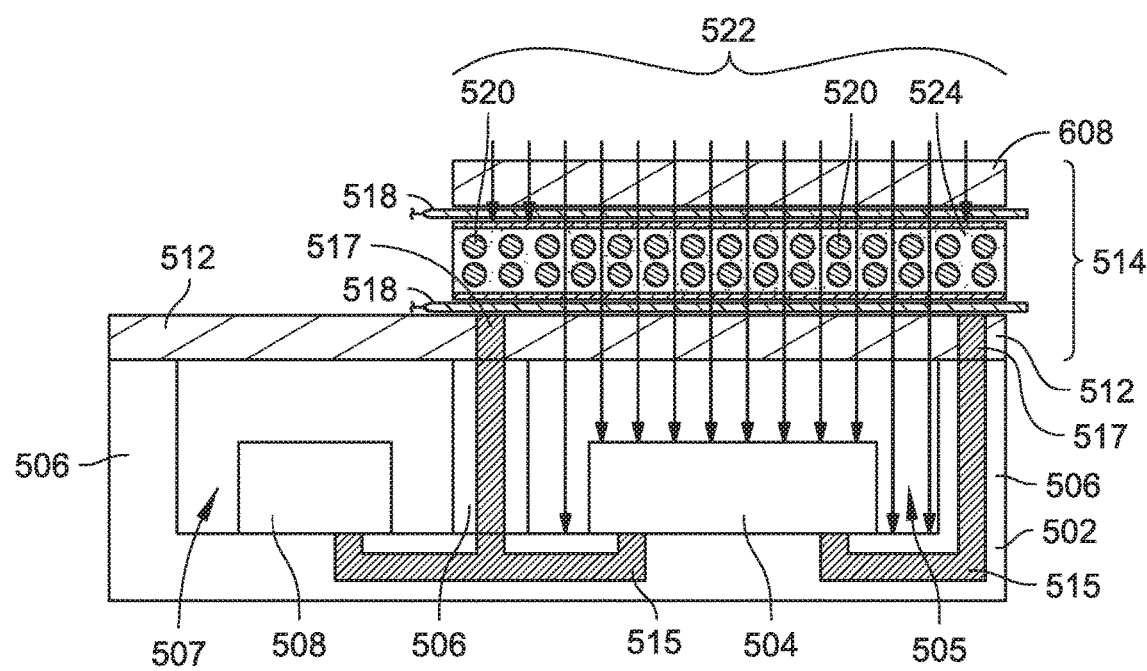
FIG. 16D is a diagrammatic partial cross-sectional side elevation view illustration of an optical sensor package with a switchable layer, in accordance with an example implementation of the present disclosure.

In the implementations shown in FIGS. 16C and 16D, an optical sensor package 500 includes a switchable layer 514 partially disposed over the cover layer 512. In these implementations, the switchable layer 514 prevents and/or allows light 522 to pass through to only the first cavity 505 and the application specific integrated circuit 504. It is contemplated that the switchable layer 514 may be disposed partially over the cover layer 512 in other configurations, such as covering the second cavity 507 and the light source 508. In the implementation shown in FIG. 16C, no electrical signal (e.g., a voltage) is applied to the conductive coating 518 and the suspended particles 520 are randomly distributed preventing light 522 from passing. In the implementation shown in FIG. 16D, an electrical signal (e.g., a voltage) is applied to the conductive coating 518 and the suspended particles 520 are aligned allowing light 522 to pass.

Figure 17A:
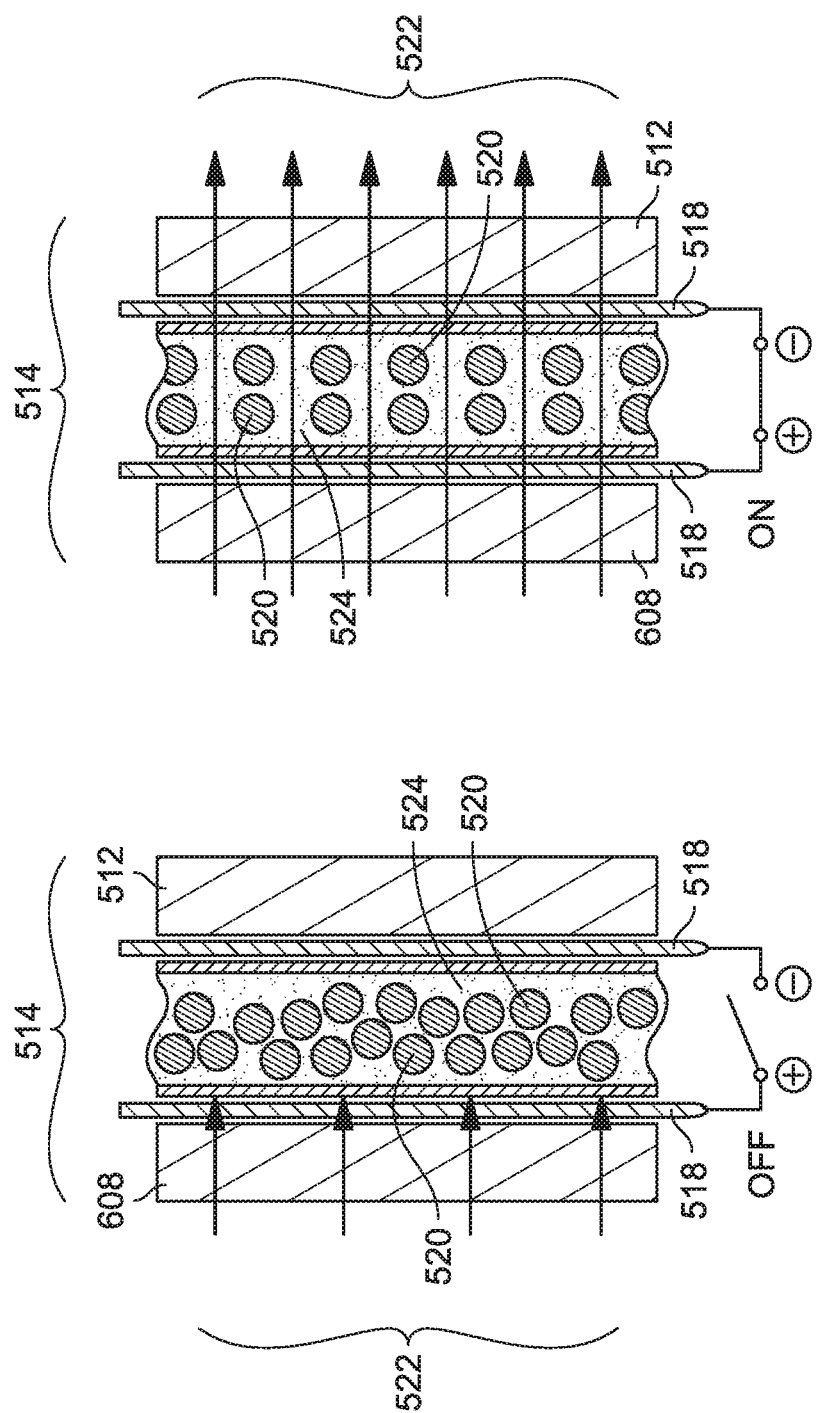
FIG. 17A is a diagrammatic partial cross-sectional side elevation view illustration of a switchable layer configured to be disposed on an optical sensor package, such as the optical sensor packages illustrated in FIGS. 16A through 16D, in accordance with an example implementation of the present disclosure.
Figure 17B:
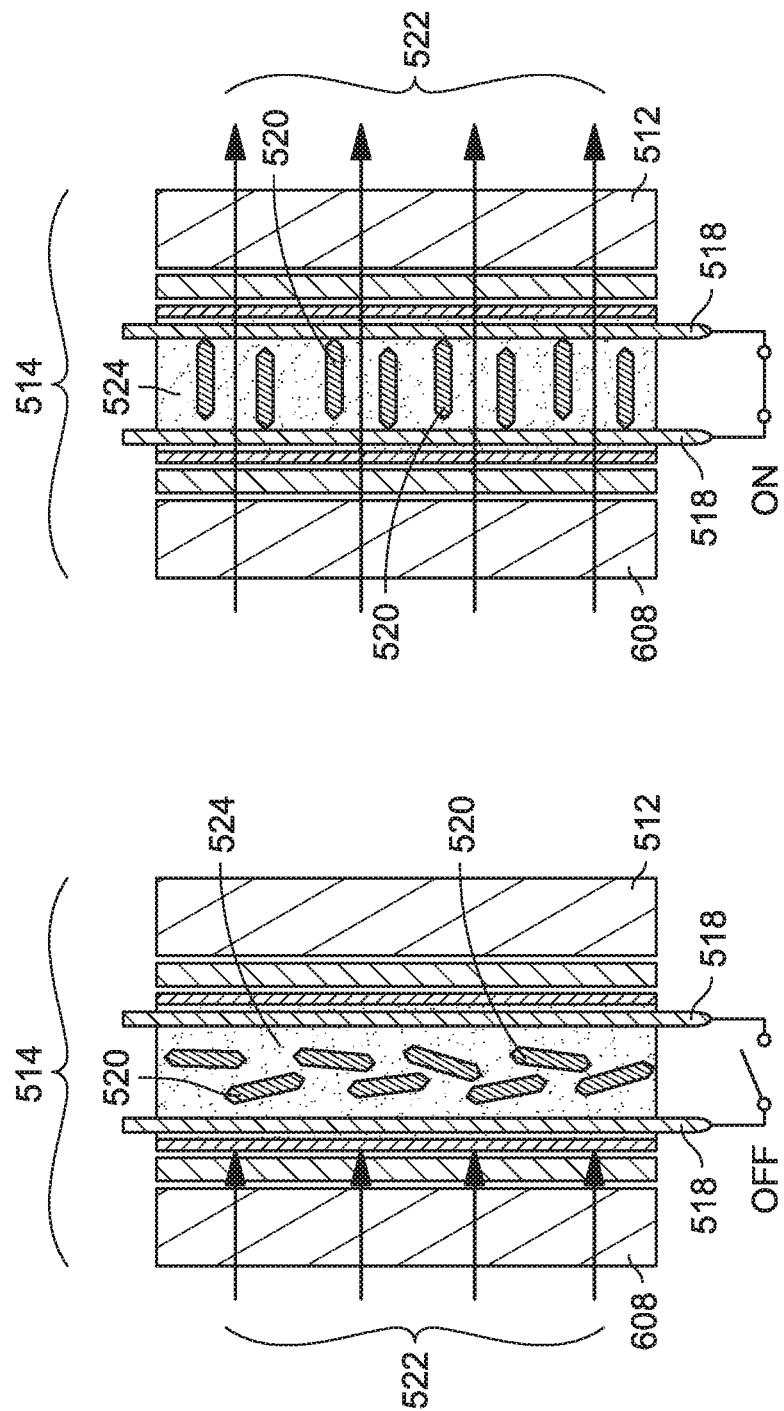
FIG. 17B is a diagrammatic partial cross-sectional side elevation view illustration of a switchable layer configured to be disposed on an optical sensor package, such as the optical sensor packages illustrated in FIGS. 16A through 16D, in accordance with an example implementation of the present disclosure.
Figure 17C:
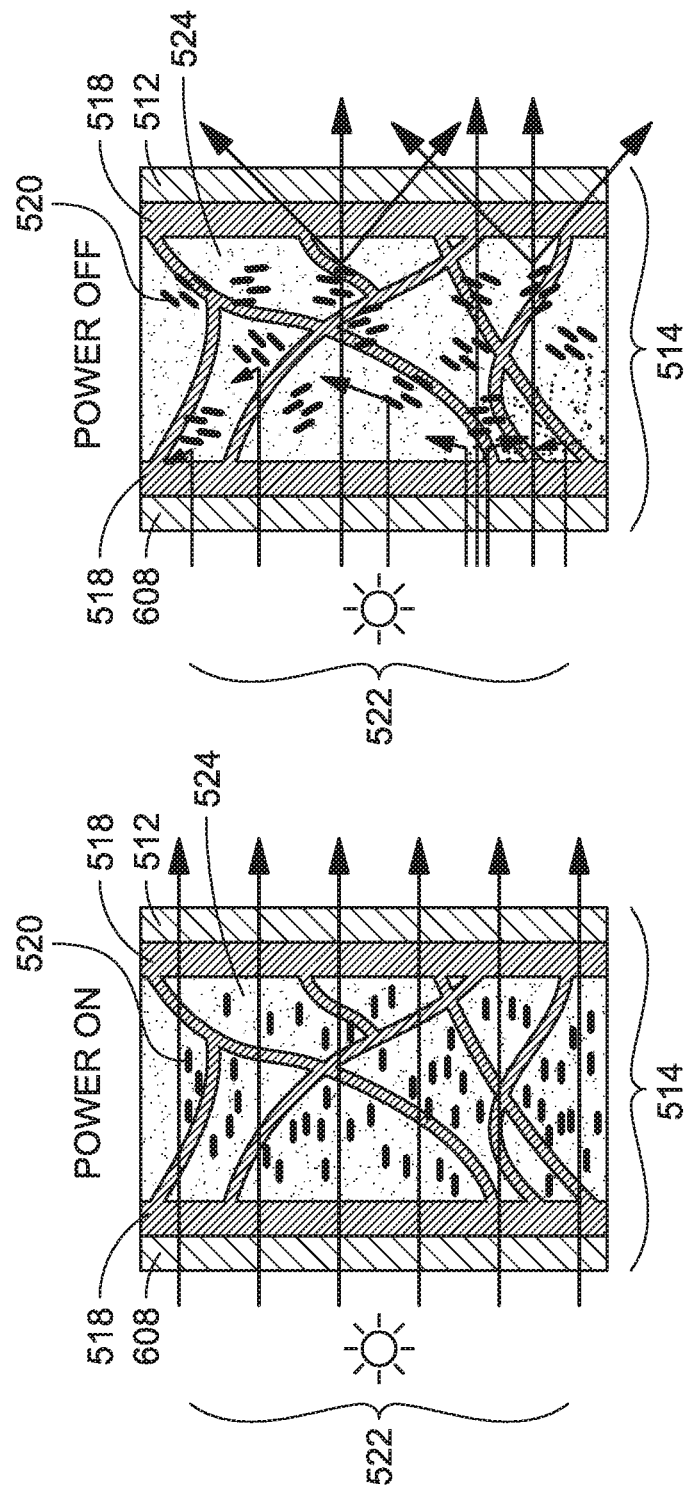
FIG. 17C is a diagrammatic partial cross-sectional side elevation view illustration of a switchable layer configured to be disposed on an optical sensor package, such as the optical sensor packages illustrated in FIGS. 16A through 16D, in accordance with an example implementation of the present disclosure.

FIGS. 17A through 17D illustrate various configurations of a switchable layer 514. FIG. 17A illustrates a switchable layer 514 comprising suspended particles 520 in a suspension fluid 524 (e.g., a suspended particle device (SPD)). In FIG. 17A, a configuration where suspended particles 520 are disposed in a random configuration is shown on the left (e.g., no electrical signal applied to conductive coating 518), and a configuration where the suspended particles 520 are aligned in the suspension fluid 524 is shown on the right (e.g., the switch applies an electrical signal applied to conductive coating 518). FIG. 17B illustrates a switchable layer 514 comprising suspended particles 520 in a suspension fluid 524 (e.g., a liquid crystal particle device). In FIG. 17B, a configuration where suspended particles 520 including liquid crystals are disposed in a random configuration is shown on the left, and a configuration where the suspended particles 520 including liquid crystals are aligned in the suspension fluid 524 is shown on the right. FIG. 17C illustrates an implementation where a switchable layer 514 comprises a polyethylene terephthalate (PET) film having suspended particles 520 including liquid crystals in a polymer network of suspension fluid 524. In FIG. 17C, a configuration where suspended particles 520 including liquid crystals are disposed in a random configuration is shown on the right, and a configuration where the suspended particles 520 including liquid crystals are aligned in the suspension fluid 524 is shown on the left. FIG. 17D illustrates an implementation where a switchable layer 514 comprises a nanocarbon ceramic film having suspended particles 520 including nanocarbon particles (e.g., 50-80 nm in diameter) and ceramic particles (e.g., 30-50 nm in diameter).

In implementations, the switchable layer 514 can include suspended particles 520 that align when an electrical signal (e.g., a voltage) is applied to the conductive coating 518 and are randomly configured when no electrical signal is applied. Additionally, some implementations include suspended particles 520 that require a constant electrical signal (e.g., a voltage) to remain aligned and/or randomized, while in other implementations, the suspended particles 520 may require a discrete electrical signal (e.g., a voltage) to align and/or randomize.

Further, different electrical signals (e.g., voltages or currents) may be applied to the switchable layer 514 and/or conductive coating 518 to control the degree of transparency and align and/or randomize the suspended particles 520 in differing amounts and/or magnitudes. The degree of transparency of the switchable layer 514 can be controlled by varying electrical signals because only a few of the suspended particles 520 align in an electric field provided by a relatively low voltage (e.g., 0.5 V) applied to the conductive coating 518. When the voltage is increased (e.g., 1.0 V), fewer suspended particles 520 remain out of alignment resulting in less light scattering. In one instance, a voltage can be applied to the conductive coating 518 to fully align the suspended particles 520 and let a full amount of light pass.

In the implementation shown in FIGS. 15A and 15B, a mobile device 600 includes an optical sensor package 500 having a switchable layer 514. Some examples of a mobile device 600 can include a portable device, such as a tablet computer, a smartphone, a mobile phone, a global positioning (GPS) device, a wearable device, a digital camera, and/or a digital media player. Additionally, the mobile device 600 can include capability for Wi-Fi, Bluetooth, wireless, and/or near field communication (NFC). In these implementations, the optical sensor package 500 may be disposed proximate to a camera 602 and/or other component of the mobile device 600. Using an optical sensor package 500 with a switchable layer 514 in a mobile device 600 provides for a more aesthetically pleasing look because the switchable layer 514 hides the optical sensor package 500 and/or the inner components of the optical sensor package 500.

In an implementation, a mobile device 600 and an optical sensor package 500 having a switchable layer 514 can match or substantially match the color of the switchable layer 514 with the color of the outside surface 599 of the mobile device 600. For example, if the outside surface 599 of the mobile device 600 is black, the color of the switchable layer 514 when activated (e.g., when a voltage is applied to the conductive coating 518 of the switchable layer 514) can be black or substantially black. Matching or substantially matching the color of the switchable layer 514 with the color of the surface of the mobile device 600 provides a more aesthetically pleasing look by obscuring the optical sensor package 500 from view. It is contemplated that the switchable layer 514 may include a variety of colors when activated. Some examples of switchable layer 514 colors can include blue, red, yellow, green, cyan, gray, silver, gold, white, slate, rose gold, pink, violet, or a combination of colors. In some implementations, at least a portion of the outside surface 599 of the mobile device 600 can include a switchable layer 514. In these implementations, the switchable layer 514 can be electrically coupled to the substrate 502 and/or other power supply through wiring or other electrical connections within the mobile device 600 case.

In an implementation, the index of refraction of the switchable layer 514 and/or the cover layer 512 can be matched or substantially matched to the index of refraction of a user's skin tissue in order to prevent light reflection and improve biometric and/or physiological measurements. In an additional implementation, a normal index of refraction of the cover layer 512/switchable layer 514 may be 1.0, while the index of refraction of a user's skin tissue may be 1.3. In this example, the switchable layer 514 can be adjusted by adjusting the electrical signal (e.g., a voltage) supplied so that the index of refraction of the cover layer 512/switchable layer 514 replicates or substantially replicates the index of refraction of skin tissue. It is contemplated that the index of refraction of the cover layer 512 and/or the switchable layer 514 can be adjusted to replicate or substantially replicate the index of refraction of other materials (e.g., gloves worn by a user).

In an implementation, a mobile device 600 that includes an optical sensor package having a switchable layer 514 can include a device (e.g., a smartphone, a biometric device, and the like) that measures vital signs, such as heart rate measurements, pulse wave velocity measurements that approximate blood pressure, and/or blood oxygen (e.g., a pulse oximeter). In another implementation, a mobile device 600 that includes an optical sensor package 500 having a switchable layer 514 can include a device (e.g., a smartphone, a digital camera, and the like) that minimizes flicker from an external source (e.g., a light source emitting a 60 hertz signal). In another implementation, a mobile device 600 that includes an optical sensor package 500 having a switchable layer 514 can include a device (e.g., a smartphone, a digital camera, and so forth) that provides white balance (e.g., extra input wavelength sources for automatic white balancing). In another implementation, a mobile device 600 that includes an optical sensor package 500 having a switchable layer 514 can include a selfie button for image capture where a user places a finger on/over the optical sensor package 500 to capture a digital image. It is contemplated that the mobile device 600 with an optical sensor package 500 having a switchable layer 514 can include other configurations, form factors, and/or functions.

The implementations shown in FIGS. 15 through 17 can employ a similar controller as shown in FIG. 11.

FIGS. 20 through 23 illustrate an implementation of an optical sensor package including a cloaking device which includes a mirror layer. Many of the components discussed in this disclosure with respect to other implementations may be present in the implementations shown in FIGS. 20-23 and many of the components may have the same or similar features as those discussed and described with respect to other implementations.

In the implementation shown in FIGS. 20-23, the optical sensor package includes a substrate, at least one wall disposed on the substrate, at least one optically transparent layer disposed on the at least one wall, where the substrate, the at least one wall, and the at least one optically transparent layer define a first cavity and a second cavity. In this implementation, an application specific integrated circuit is disposed on the substrate and in the first cavity, and a light source is disposed on the substrate and in the second cavity. A mirror layer is disposed proximate to (e.g., on or near) the optically transparent layer. In another implementation, a device includes a mobile device including the optical sensor package previously described, where the optical sensor package includes a mirror layer disposed on the optically transparent layer.

In an implementation, a process for fabricating an optical sensor package that employs example techniques in accordance with the present disclosure. The process includes forming at least one wall on a substrate, placing an application specific integrated circuit on the substrate, and placing a light source on the substrate. Additionally, an optically transparent layer is placed on the at least one wall, where the substrate, the at least one wall, and the optically transparent layer define a first cavity including the application specific integrated circuit and a second cavity including the light source. Further, a mirror layer is placed on the optically transparent layer, which cloaks and/or obscures the optical sensor package from a user's view. For example, the mirror layer may be configured to optically (e.g., visually) conceal, cloak, or obscure the optical sensor package from the user's view.

Utilizing an optical sensor package having a mirror layer disposed on the optically transparent layer provides an aesthetically pleasing device because the mirror layer becomes reflective and/or replicates the color of the mobile device color.

FIGS. 20A through 21E illustrate an optical sensor package 800 and a mobile device 900 in accordance with an example implementation of the present disclosure. The optical sensor package 800 and the mobile device 900 described herein each include a mirror layer 814 configured to make the optical sensor package 800 aesthetically pleasing while maintaining sensor functionality.

In implementations, the optical sensor package 800 can include a substrate 802. In implementations, the substrate 802 can include a panel and/or a board suitable to mechanically support and electrically connect electronic components (e.g., optical sensor, light source, etc.) using conductive tracks, traces, pads, redistribution layers, vias, and other features that may be etched from copper sheets or other electrically conductive material laminated onto a non-conductive substrate. In one implementation, the substrate 802 can be formed from a glass epoxy material (e.g., a printed circuit board), such as FR-4 glass epoxy (a composite material composed of woven fiberglass cloth with an epoxy resin binder). For example, the substrate 802 can include a portion of a printed circuit board and/or a flexible printed circuit board that has contact pads that are configured to be coupled to a light source 808 and an application specific integrated circuit 804. It is contemplated that the substrate 802 may include other materials, such as other glass epoxy, ceramic, glass, a polymer, and/or silicon. For example, the substrate 802 can include a portion of a glass epoxy panel that includes contact pads that are configured to couple to electronic devices, such as a light source 808 and an application specific integrated circuit 804. In some examples, the glass panel may be made from a flexible material. In other examples, the glass panel may have an arcuate profile.

As illustrated in FIGS. 20A through 21E, the optical sensor package 800 can include at least one wall 806 disposed on the substrate 802. In implementations, the wall 806 can fabricated of the same or a similar material (e.g., a glass epoxy-based printed circuit board, ceramic) as the substrate 802. However, other (different) materials may be used. Additionally, the wall 806 can be coupled to the substrate 802 such that the wall 806 is perpendicular to the substrate 802. In one implementation, the optical sensor package 800 includes a substrate 802 with four walls 806 coupled perpendicularly to the substrate 802, with the four walls 806 and the substrate 802 partially defining a box. In this implementation, another wall 806 can be coupled to the substrate 802 and two other walls 806 where a first cavity 805 and a second cavity 807 are at least partially defined. It is contemplated that the substrate 802 and at least one wall 806 may be coupled and arranged in other configurations. Further, the at least one wall 806 and/or substrate 802 may include electrical routing and connections, such as a redistribution layer, contact pads, through vias, wiring, electrically conductive traces, and so forth.

As illustrated in FIGS. 20A through 21E, the optical sensor package 800 can include an optically transparent layer 812 disposed on the at least one wall 806. In this configuration, the optically transparent layer 812, the at least one wall 806, and the substrate 802 define a first cavity 805 and a second cavity 807. In implementations, the optically transparent layer 812 can include a singulated portion of a glass sheet that is transparent to a variety of light and/or energy wavelengths (e.g., visible light (e.g., 400 to 800 nm wavelengths), ultraviolet light (e.g., 10 to 400 nm wavelengths), infrared light (e.g., 800 nm to 1 mm wavelengths), and so forth). The optically transparent layer 812 can be coupled to the at least one wall 806 using a variety of methods, such as using an adhesive. In one example, the optically transparent layer 812 can include an alkali-free flat glass using a down-draw method between about 0.03 millimeters and about 1.1 millimeters in thickness. In another example, the optically transparent layer 812 can include a clear borosilicate glass with a high chemical resistance between about 0.03 millimeters and about 1.1 millimeters in thickness. It is contemplated that the optically transparent layer 812 may include a variety of other configurations and/or materials (e.g., silicon, quartz, sapphire, etc.). In some implementations, the optically transparent layer 812 can comprise optically transparent materials other than glass, such as a polymer. In some instances, the optically transparent layer 812 may not be flush with the outside surface of the mobile device 900.

The optical sensor device 800 can include an application specific integrated circuit (ASIC) 804 disposed on the substrate 802 and within the first cavity 805. In implementations, the application specific integrated circuit 804 can include a sensor, such as an optical sensor (e.g., a photodiode, a thermopile). In one implementation, the application specific integrated circuit 804 can include an optical sensor having an active portion that can detect one or more wavelengths of light (e.g., visible wavelengths of light, infrared wavelengths of light, ultraviolet wavelengths of light) that passes through the optically transparent layer 812 and the first cavity 805. The application specific integrated circuit 804 can be disposed in the first cavity 805 and can be optically isolated from the second cavity 807 (e.g., by one or more walls 806). In some implementations, the optical sensor device 800 may include multiple application specific integrated circuit 804 dies. In the case where the application specific integrated circuit 804 includes an optical sensor, the active portion of the application specific integrated circuit 804 can be disposed facing the optically transparent layer 812 so that light passing through the optically transparent layer 812 is incident on the application specific integrated circuit 804. The application specific integrated circuit 804 can be placed on the substrate 802 using, for example, pick-and-place techniques. For example, solder bumps and contact pads may be used to electrically and/or mechanically couple the application specific integrated circuit 804 to the substrate 802.

Additionally, the optical sensor device 800 can include a light source 808 disposed on the substrate 802 and within the second cavity 807. Some examples of a light source 808 can include a light-emitting diode (LED) or a vertical-cavity surface-emitting laser. It is contemplated that the light source 808 may include other types of sources of light. In one specific implementation, the light source 808 includes an LED that emits light where the light is transmitted through the optically transparent layer 812 to an external object (e.g., a body structure such as skin tissue). The light source 808 can be electrically and/or mechanically coupled to the substrate 802 and/or the application specific integrated circuit 804. It is contemplated that the optical sensor device 800 can include multiple light sources 808. For example, the optical sensor device 800 may include an ultraviolet light-emitting diode and a vertical-cavity surface-emitting laser (VCSEL).

As illustrated in FIGS. 20A through 21E, the optical sensor device 800 can include at least one mirror layer 814 disposed on, over, and/or proximate to the optically transparent layer 812. In implementations, a mirror layer 814 can include a material that is partially reflective and partially transparent. When one side of the mirror layer 814 is brightly lit (e.g., a side of the mirror layer 814 that faces away from the optical sensor device 800), much of the light 822 incident upon the mirror layer 814 is reflected giving a mirrored appearance, while still allowing at least a portion of light to pass from a light source 808 and/or to an application specific integrated circuit 804. In one example, the mirror layer 814 can include a thin layer of metal, such as aluminum. Other examples of mirror layer 814 materials can include silver, copper, a dielectric material (e.g., polymer, a non-organic, and so forth), and/or an inorganic color ink, and/or a combination thereof. It is contemplated that the mirror layer 814 can include other materials. In implementations, the mirror layer 814 can be formed and/or placed, for example, as a film layer and/or using a deposition process, such as sputtering. Additionally, the thickness of the mirror layer 814 may include a variety of thickness depending on the desired amount of reflectivity and/or transparency of the mirror layer 814. In one instance, the mirror layer 814 may be about 10 nm thick. In another instance, the mirror layer 814 may be about 50 nm thick. It is contemplated that the mirror layer 814 may include other thicknesses or configurations. In the implementation illustrated in FIG. 21A, the mirror layer 814 is disposed on a side of the optically transparent layer 812 distal from the substrate 802. In the implementation illustrated in FIG. 21B, the mirror layer 814 is disposed on a side of the optically transparent layer 812 most proximate to the substrate 802.

In some implementations, the optical sensor package 800 may include multiple optically transparent layers 812 and/or mirror layers 814. In the implementation illustrated in FIG. 21C, the optical sensor package 800 includes a first optically transparent layer 812 disposed on the at least one wall 806, a mirror layer 814 disposed on the first optically transparent layer 812, and a second optically transparent layer 813 disposed on the mirror layer 814. In the implementation illustrated in FIG. 21D, the optical sensor package 800 includes a first mirror layer 814 disposed on a side of the optically transparent layer 812 most proximate to the substrate 802 and a second mirror layer 815 distal from the substrate 802. It is contemplated that the optical sensor package 800 can include a variety of other configurations of optically transparent layers and/or mirror layers.

Figure 21A:
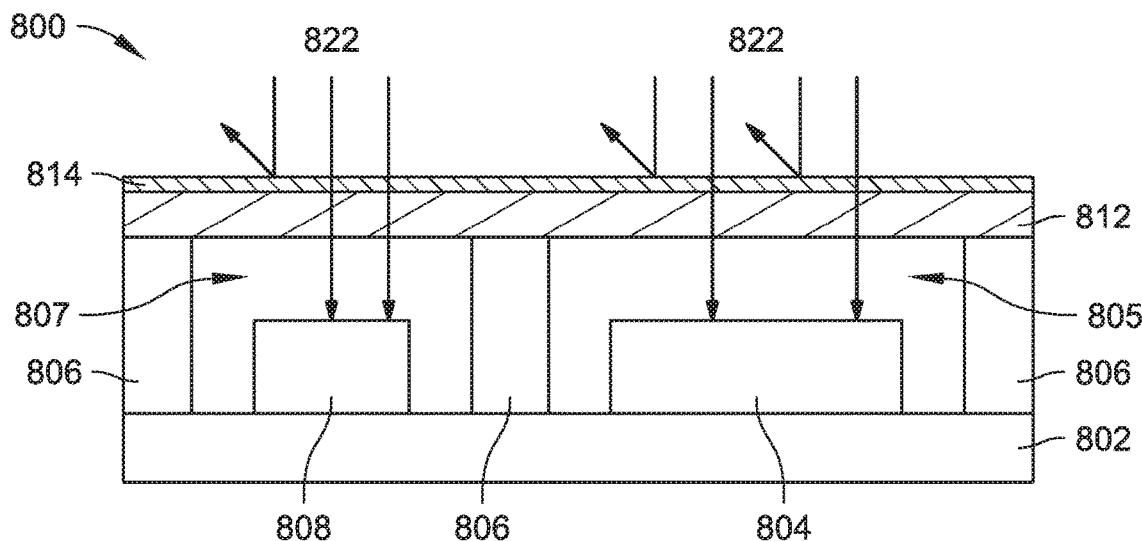
FIG. 21A is a diagrammatic partial cross-sectional side elevation view illustration of an optical sensor package with a mirror layer, in accordance with an example implementation of the present disclosure.
Figure 21B:
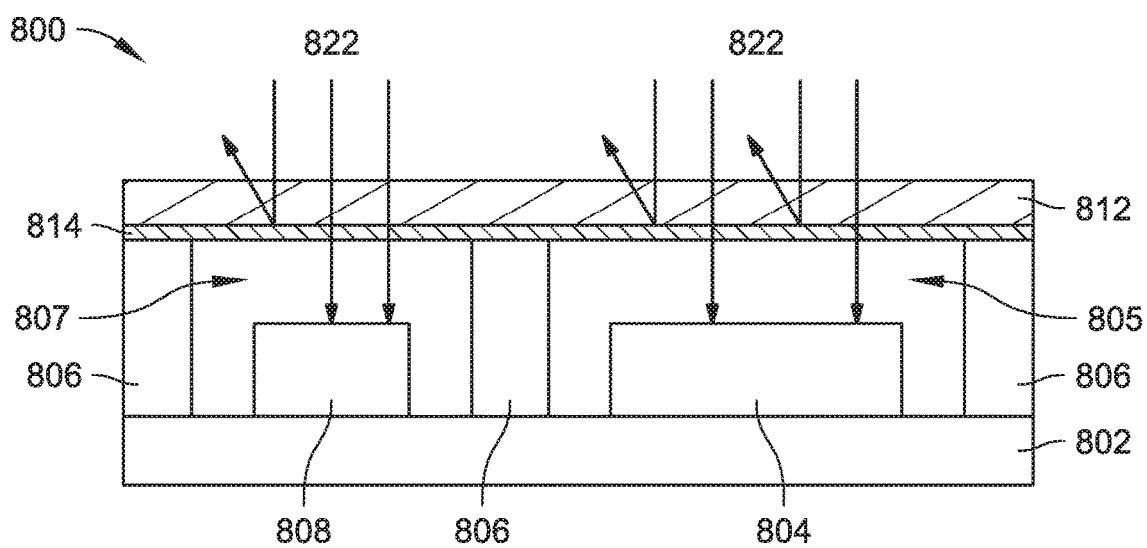
FIG. 21B is a diagrammatic partial cross-sectional side elevation view illustration of an optical sensor package with a mirror layer, in accordance with an example implementation of the present disclosure.
Figure 21C:
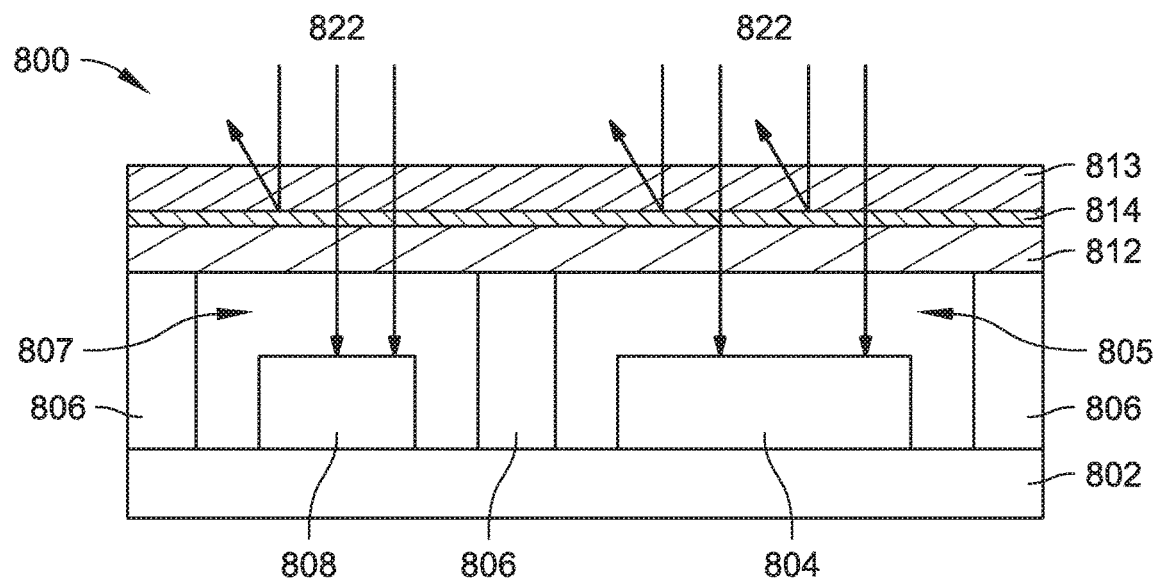
FIG. 21C is a diagrammatic partial cross-sectional side elevation view illustration of an optical sensor package with a mirror layer, in accordance with an example implementation of the present disclosure.
Figure 21D:
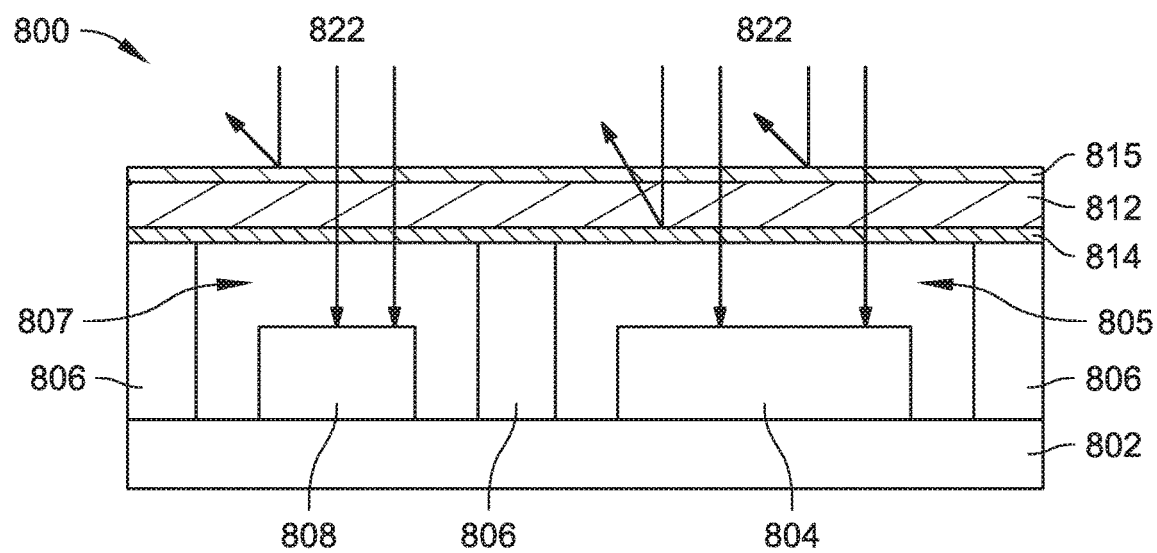
FIG. 21D is a diagrammatic partial cross-sectional side elevation view illustration of an optical sensor package with a mirror layer, in accordance with an example implementation of the present disclosure.
Figure 21E:
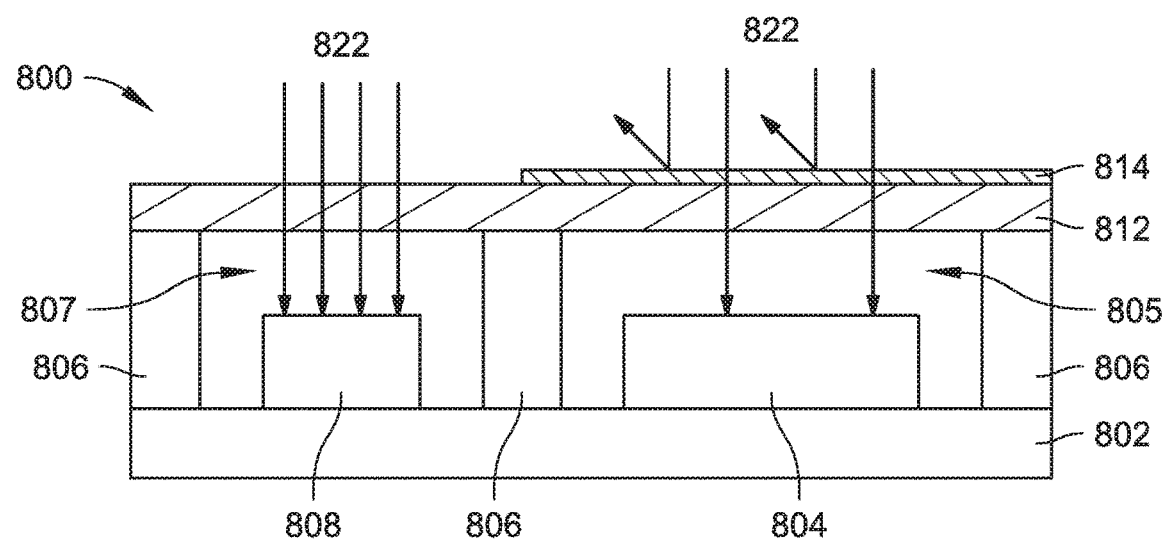
FIG. 21E is a diagrammatic partial cross-sectional side elevation view illustration of an optical sensor package with a mirror layer, in accordance with an example implementation of the present disclosure.

In the implementation shown in FIG. 21E, an optical sensor package 800 includes a mirror layer 814 partially disposed over the optically transparent layer 812. In this implementation, the mirror layer 814 provides a mirrored appearance over only a portion of the optical sensor package 800 and prevents and/or allows a portion of incident light 822 to partially pass to and/or from the first cavity 805 and/or the application specific integrated circuit 804. It is contemplated that the mirror layer 814 may be disposed partially over the optically transparent layer 812 in other configurations, such as being disposed on the optically transparent layer 812 over the second cavity 807 and the light source 808. In one implementation, at least a portion of the mobile device 900 case can include a mirror layer 814.

In the implementation shown in FIGS. 20A and 20B, a mobile device 900 includes an optical sensor package 800 having a mirror layer 814. Some examples of a mobile device 900 can include a portable device, such as a tablet computer, a smartphone, a global positioning (GPS) device, a wearable device, and/or a digital media player. Additionally, the mobile device 128 can include capability for Wi-Fi, Bluetooth, wireless, and/or near field communication (NFC). In these implementations, the optical sensor package 800 may be disposed proximate to a camera 902 and/or other component of the mobile device 900. FIG. 20A illustrates a front view of an exemplary mobile device 900 having a screen 904 and a control button 906 and/or surface. FIG. 20B illustrates a rear view (e.g., opposite the front view) having an optical sensor package 800. Using an optical sensor package 800 with a mirror layer 814 in a mobile device 900 provides for a more aesthetically pleasing look because the mirror layer 814 at least partially hides the optical sensor package 800 and/or the inner components of the optical sensor package 800.

In an implementation, a mobile device 900 that includes an optical sensor package having a mirror layer 814 can include a device (e.g., a smartphone, a biometric device, and the like) that measures vital signs, such as heart rate measurements, pulse wave velocity measurements that approximate blood pressure, and/or blood oxygen (e.g., a pulse oximeter). In another implementation, a mobile device 900 that includes an optical sensor package 800 having a mirror layer 814 can include a device (e.g., a smartphone, a digital camera, and the like) that minimizes flicker from an external source (e.g., a light source emitting a 60 hertz signal). In another implementation, a mobile device 900 that includes an optical sensor package 800 having a mirror layer 814 can include a device (e.g., a smartphone, a digital camera, and so forth) that provides white balance (e.g., extra input wavelength sources for automatic white balancing). In another implementation, a mobile device 900 that includes an optical sensor package 800 having a mirror layer 814 can include a selfie button for image capture where a user places a finger on/over the optical sensor package 800 to capture a digital image. It is contemplated that the mobile device 128 with an optical sensor package 800 having a mirror layer 814 can include other configurations, form factors, and/or functions.

The implementations shown in FIGS. 20 through 23 can employ a similar controller as shown in FIG. 11.

Example Processes

Figure 13:
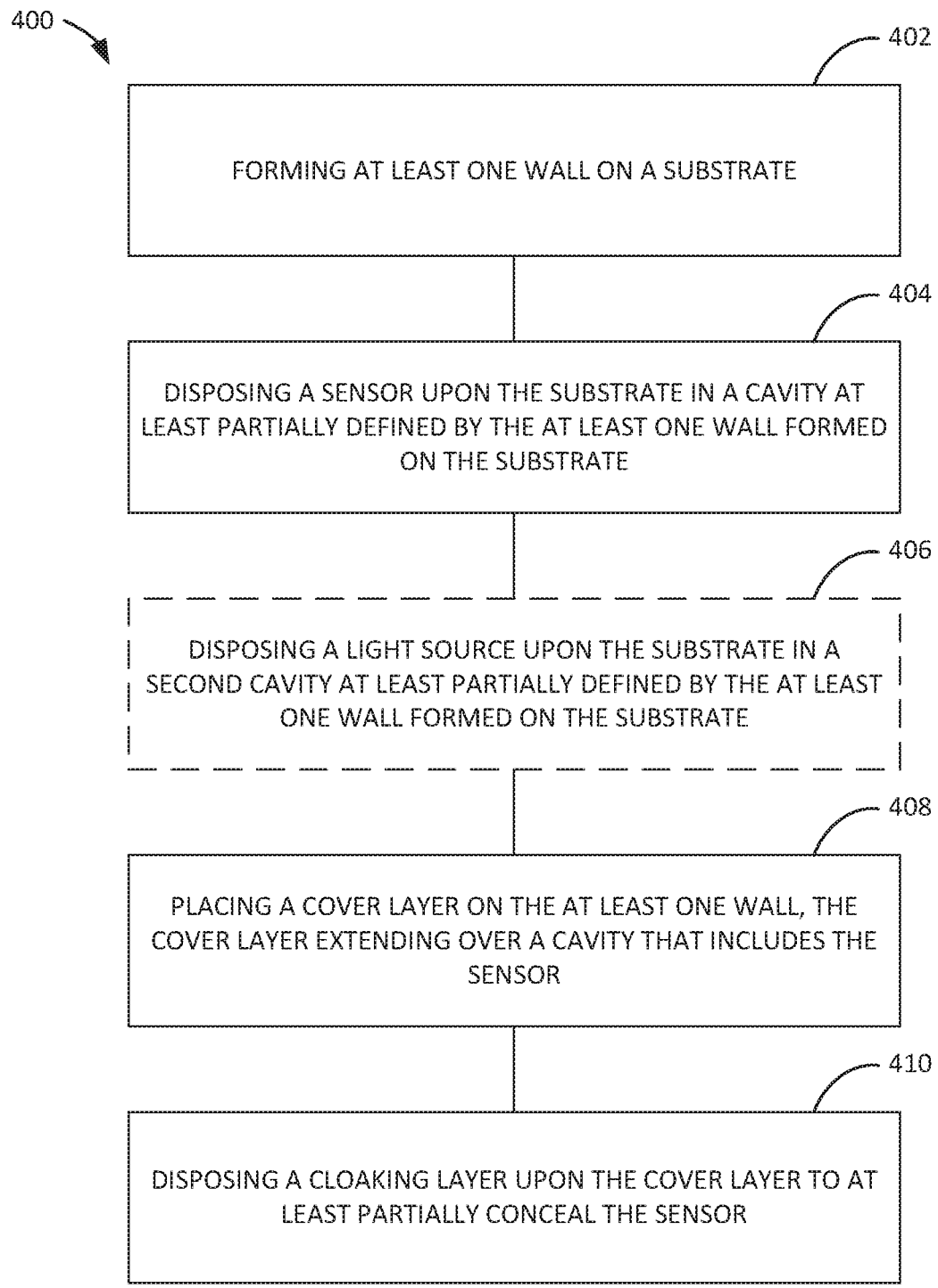
FIG. 13 is a flow diagram illustration of an example process for fabricating an optical sensor package with a cloaking layer, such as the optical sensor packages illustrated in FIGS. 2A and 2B, or in any of FIGS. 4A through 10.

FIG. 13 illustrates an example process 400 that employs techniques to fabricate an optical sensor package, such as the optical sensor package 100 shown in FIGS. 1A through 10. FIGS. 14A through 14E illustrate a section of an optical sensor package during fabrication. In general, operations of disclosed processes (e.g., process 400) may be performed in an arbitrary order, unless otherwise provided in the claims.

In the process 400 illustrated in FIG. 13, at least one wall is formed on a substrate (Block 402). In the implementation shown in FIG. 14A, at least one wall 106 is placed or otherwise formed on the substrate 102 in a perpendicular configuration (e.g., wall 106 extends away from the substrate 102). In one implementation, forming the walls 106 and/or wall 110 on the substrate 102 can include using a pick-and-place and bonding operation to place individual walls 106 and/or 110. In another implementation, forming the walls 106 and/or 110 on the substrate 102 can include using an etching process (e.g., reactive ion etching) to selectively etch a portion of the substrate 102 (e.g., a glass or ceramic) to form one or more cavities. It is contemplated that a variety of processes can be used for forming at least one wall 106, wall 106 or wall 110 on a substrate 102. In some implementations, at least one inner wall 110 is formed between two or more outer walls 106 to at least partially define a first cavity 105 and a second cavity 107.

Figure 14A:
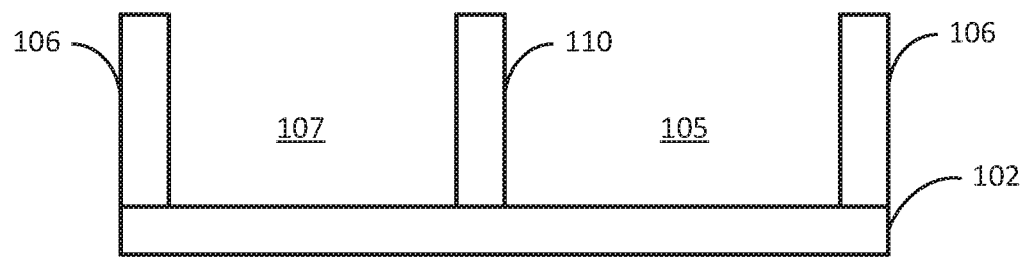
FIG. 14A is a diagrammatic partial cross-sectional side elevation view illustration of the fabrication of an optical sensor package with a cloaking layer, such as the optical sensor packages shown in FIGS. 2A and 2B, or in any of FIGS. 4A through 10, in accordance with the process shown in FIG. 13.
Figure 14B:
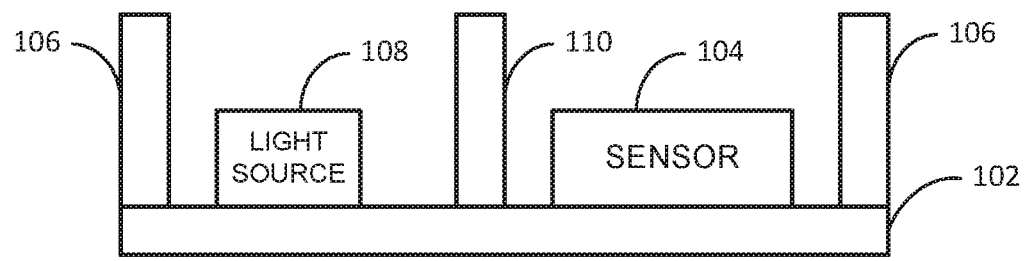
FIG. 14B is a diagrammatic partial cross-sectional side elevation view illustration of the fabrication of an optical sensor package with a cloaking layer, such as the optical sensor packages shown in FIGS. 2A and 2B, or in any of FIGS. 4A through 10, in accordance with the process shown in FIG. 13.

A sensor 404 is disposed upon the substrate in a cavity (e.g., cavity 105) at least partially defined by the wall or walls formed on the substrate 102 (Block 404). As illustrated in FIG. 14B, sensor 104 can be placed on the substrate 102. In an implementation, the sensor 104 can be placed on the substrate 102 and/or within a cavity (e.g., between walls 106 and/or between an outer wall 106 and an inner wall 110) using pick-and-place surface mount techniques. Placing the sensor 104 on the substrate 102 can include using a reflow process for coupling a solder connection on the sensor 104 to a corresponding connection on the substrate 102.

In some implementations, a light source 108 is disposed upon on the substrate 102 in a second cavity (e.g., cavity 107) at least partially defined by the wall or walls formed on the substrate 102 (Block 406). As illustrated in FIG. 14B, a light source 108 can be placed on the substrate 102. In an implementation, the light source 108 can be placed on the substrate 102 and/or within the second cavity 107 using pick-and-place surface mount techniques. Placing the light source 108 on the substrate 102 can include using a reflow process for coupling a solder connection on the light source 108 to a corresponding connection on the substrate 102. It is contemplated that the light source 108 may be placed on the substrate 102 proximate in time to placing the sensor 104, and solder connections on the sensor 104 and the light source 108 may be simultaneously reflowed, for example.

Figure 14C:
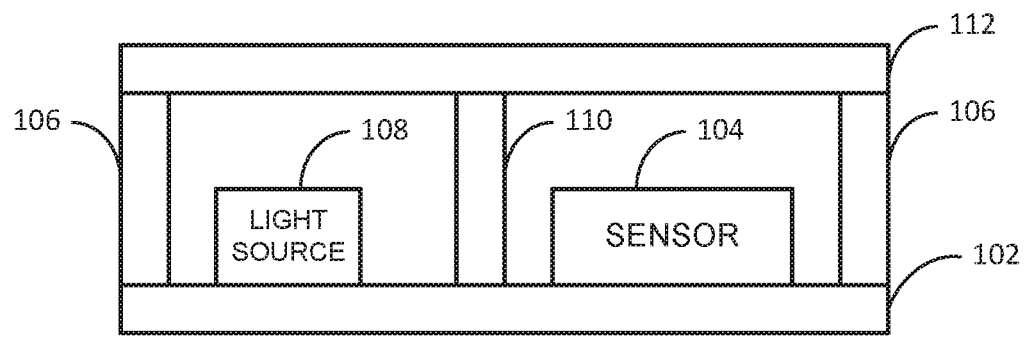
FIG. 14C is a diagrammatic partial cross-sectional side elevation view illustration of the fabrication of an optical sensor package with a cloaking layer, such as the optical sensor packages shown in FIGS. 2A and 2B, or in any of FIGS. 4A through 10, in accordance with the process shown in FIG. 13.
Figure 14D:
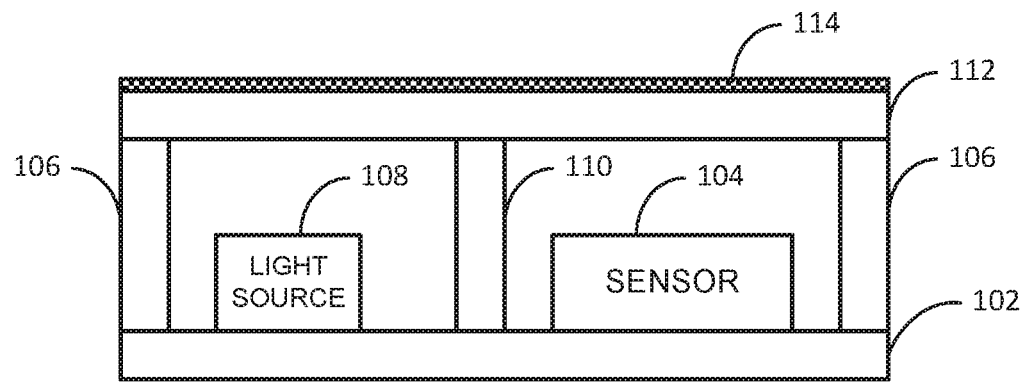
FIG. 14D is a diagrammatic partial cross-sectional side elevation view illustration of the fabrication of an optical sensor package with a cloaking layer, such as the optical sensor packages shown in FIGS. 2A and 2B, or in any of FIGS. 4A through 10, in accordance with the process shown in FIG. 13.

A cover layer 112 is placed on the wall or walls, extending over the sensor 104 (Block 408). In some implementations, the cover layer 112 is positioned across a first cavity 105 and second cavity 107 containing the sensor 104 and the light source 108, respectively (e.g., as shown in FIG. 14C). In the implementation illustrated in FIG. 14C, the cover layer 112 is placed on the wall 106 subsequent to placing the sensor 104 and the light source 108. Placing the cover layer 112 can include using an automated pick-and place process to apply an adhesive, place the cover layer 112 on the adhesive, and/or cure the adhesive. Examples of an adhesive can include a heat-cured glue, a laser-cured glue, a UV-cured glue, a cryogenic glue, or the like.

A cloaking layer 114 is disposed upon or formed by processing a portion of the cover layer 112 (e.g., an upper surface, a lower surface or both of the cover layer 112) to at least partially conceal the optical sensor package 100 and/or inner components (e.g., sensor 104 and/or light source 108, etc.) of the optical sensor package 100 (block 410). In the implementation illustrated in FIG. 14D, a cloaking layer 114 is disposed upon or formed by processing a surface of the cover layer 112 to conceal the sensor 104. For example, the cloaking layer 114 can include any of the cloaking layer 114 structures described herein, including, but not limited to: a solid ink layer 118, a patterned ink layer 120, a patterned metal layer 122, a dielectric layer 124, an etched surface of the cover layer 112, an additive deposited upon a surface of the cover layer, any combination of the foregoing, and so forth. In an implementation, the cloaking layer 114 is printed, etched, sputtered, or otherwise disposed upon on an upper surface (e.g., surface 113) of the cover layer 112. For example, the cloaking layer 114 can be disposed upon the upper surface of the cover layer 112 before or after the cover layer 112 is mounted to wall 106. In another implementation, the cloaking layer 114 is printed, etched, sputtered, or otherwise disposed upon on a lower surface (e.g., surface 111) of the cover layer 112. For example, the cloaking layer 114 can be disposed upon the lower surface of the cover layer 112 before the cover layer 112 is mounted to wall 106.

Figure 14E:
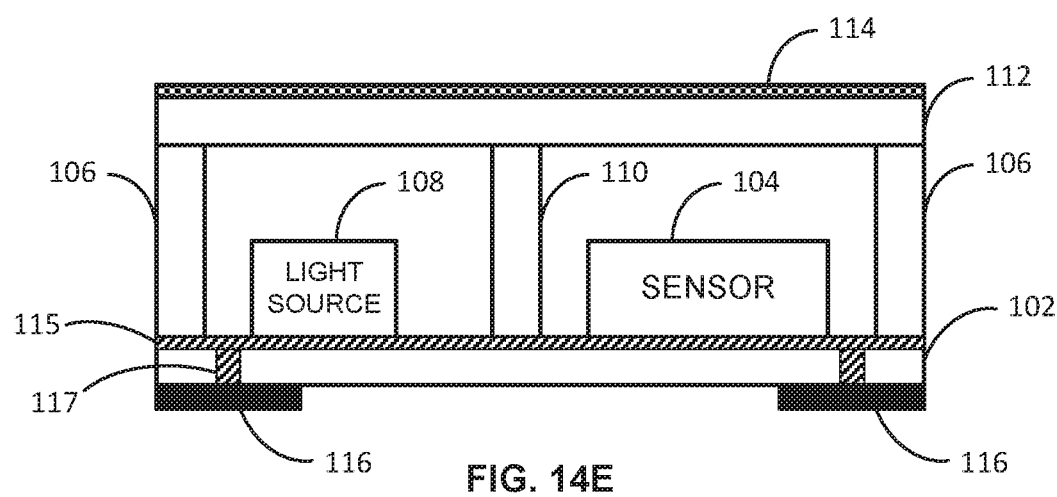
FIG. 14E is a diagrammatic partial cross-sectional side elevation view illustration of the fabrication of an optical sensor package with a cloaking layer, such as the optical sensor packages shown in FIGS. 2A and 2B, or in any of FIGS. 4A through 10, in accordance with the process shown in FIG. 13.

The process 400 can include additional stages, which may occur in an order (e.g., an order other than the order illustrated in FIGS. 13 through 14E). For example, FIG. 14E shows connectors 116 formed on a lower surface a lower surface of the substrate 102 (e.g., a surface opposite the surface on which the sensor 104 is disposed). In some implementations, the connectors 116, redistribution layer 115, and/or vias 117 can be formed on the substrate 102 prior to forming one or more walls and/or placing the sensor 104 on the substrate. The connectors 116 can include contact pads, connector pins, solder balls, female connector sockets, or any other metal or electrical connection formed at the lower surface of the substrate 102. In some implementations, vias 117 (e.g., through silicon vias (TSVs)) are formed through the substrate to establish connections between the sensor 104 (or light source 108) and the connectors 116. The substrate 102 may also have a redistribution layer 115 disposed upon the substrate 102 to establish connections between sensor 104 (or light source 108) pins and the connectors 116 on the lower surface of the substrate 102. In some implementations, the connectors 116 are formed at the sides of the optical sensor package 100 instead of or in addition to the lower surface of the substrate 102.

Some additional processes in fabricating an optical sensor package 100 may include segmenting the optical sensor package 100 from a panel (e.g., a substrate, a wafer, or the like), coupling the optical sensor package 100 to an external device, such as a printed circuit board in a mobile device 200, and/or using a reflow process.

Figure 18:
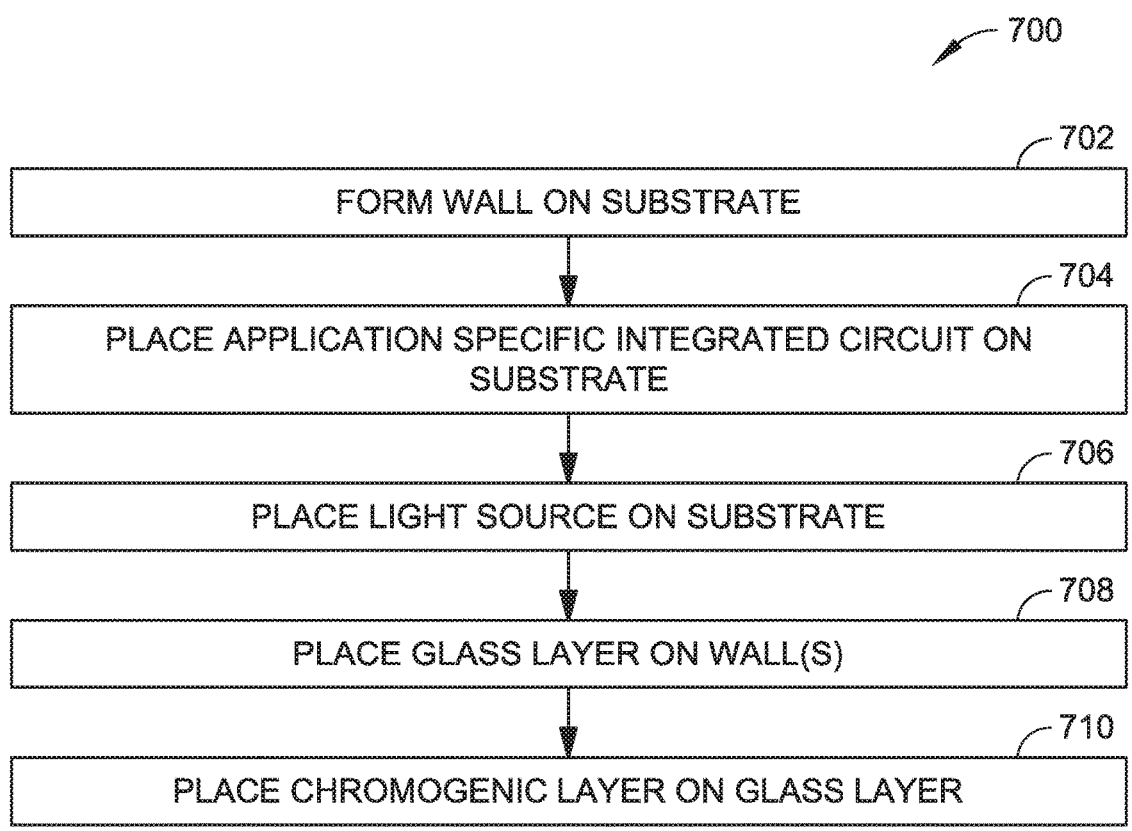
FIG. 18 is a flow diagram illustration of an example process for fabricating an optical sensor package with a switchable layer, such as the optical sensor packages illustrated in FIGS. 15A through 16D.

FIG. 18 illustrates an example process 700 that employs techniques to fabricate an optical sensor package, such as the optical sensor package 500 shown in FIGS. 15 through 17. FIGS. 19A through 19E illustrate a section of an optical sensor package during fabrication. In general, operations of disclosed processes (e.g., process 700) may be performed in an arbitrary order, unless otherwise provided in the claims.

In the process 700 illustrated, at least one wall is formed on a substrate (Block 702). In the implementation shown in FIG. 19A, at least one wall 506 is placed or otherwise formed on the substrate 502 in a perpendicular configuration (e.g., a wall 506 extends away from the substrate 502). In one implementation, forming the wall(s) 506 on the substrate 502 can include using a pick-and-place and bonding operation to place individual walls 506. In another implementation, forming the wall 506 on the substrate 502 can include using an etching process to selectively etch a portion of the substrate 502 (e.g., a glass or ceramic) to form a first cavity 505 and/or a second cavity 507. It is contemplated that a variety of processes can be used for forming at least one wall 506 on a substrate 502. Additionally, forming at least one wall 506 on the substrate 502 can include forming at least one electrical connection (e.g., a redistribution layer 515, a contact pad, and so forth) in and/or on the substrate 502 and/or at least one wall 506 using deposition, lithographic, and/or etching processes.

Figure 19A:
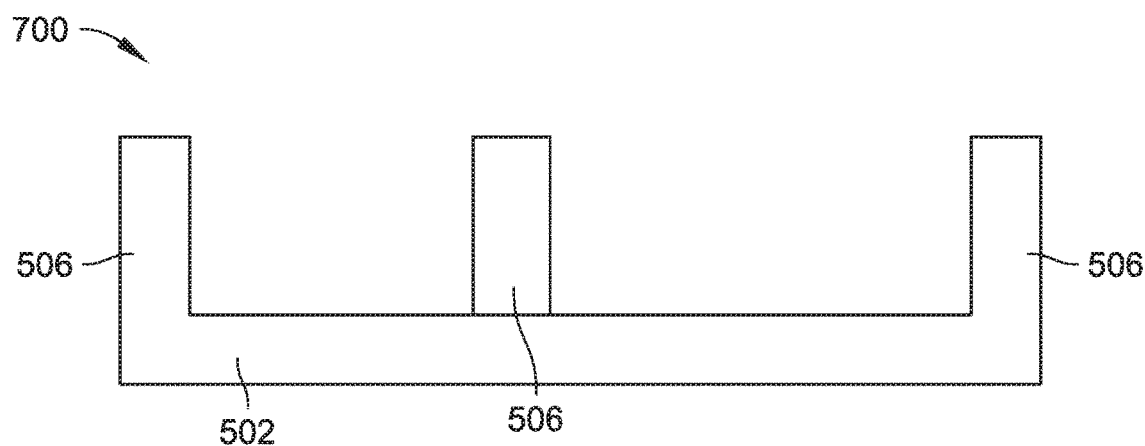
FIG. 19A is a diagrammatic partial cross-sectional side elevation view illustration of the fabrication of an optical sensor package with a switchable layer, such as the optical sensor packages shown in FIGS. 16A through 16D in accordance with the process shown in FIG. 18.
Figure 19B:
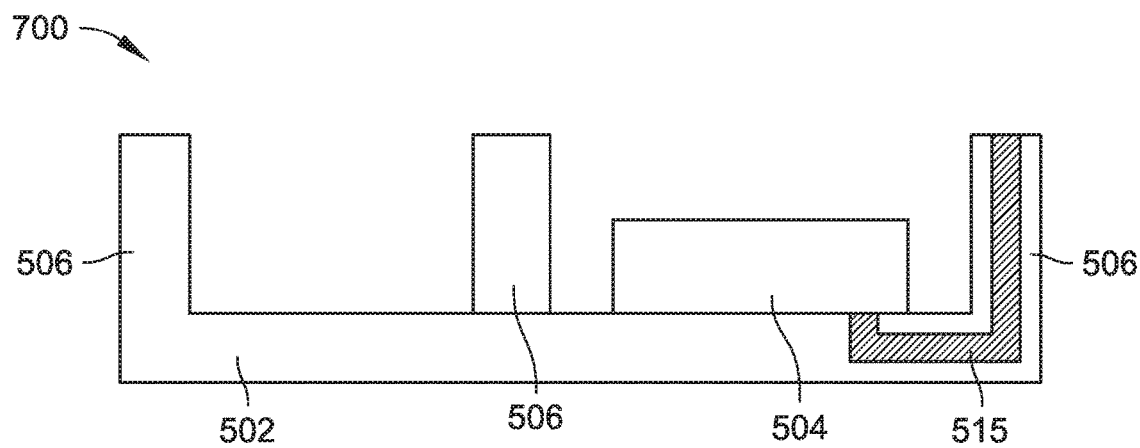
FIG. 19B is a diagrammatic partial cross-sectional side elevation view illustration of the fabrication of an optical sensor package with a switchable layer, such as the optical sensor packages shown in FIGS. 16A through 16D in accordance with the process shown in FIG. 18.

Then, an application specific integrated circuit is placed on the substrate (Block 704). As illustrated in FIG. 19B, an application specific integrated circuit 504 can be placed on the substrate 502. In an exemplary implementation, the application specific integrated circuit 504 can be placed on the substrate 502 and/or within a first cavity 505 using pick-and-place surface mount techniques. Placing the application specific integrated circuit 504 on the substrate 502 can include using a reflow process for coupling a solder connection on the application specific integrated circuit 504 to a corresponding connection on the substrate 502.

Figure 19C:
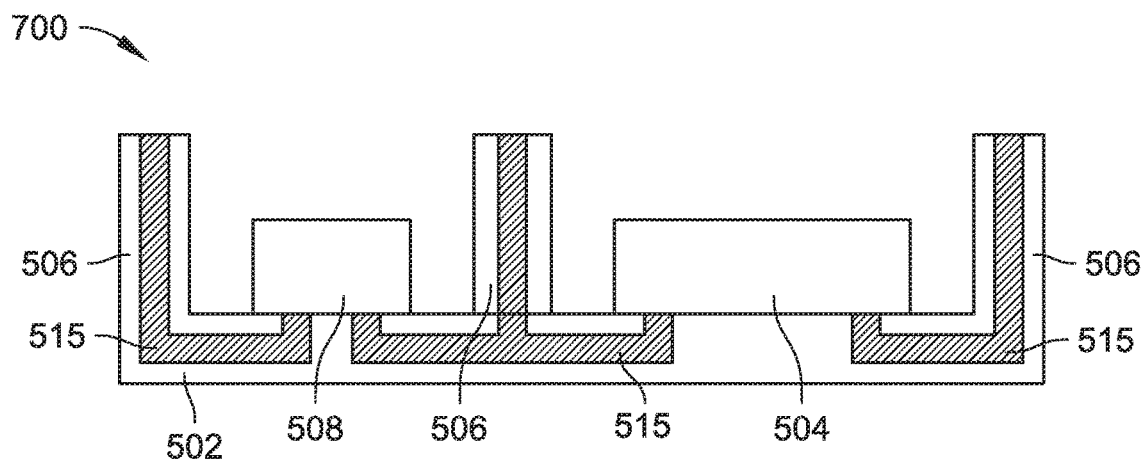
FIG. 19C is a diagrammatic partial cross-sectional side elevation view illustration of the fabrication of an optical sensor package with a switchable layer, such as the optical sensor packages shown in FIGS. 16A through 16D in accordance with the process shown in FIG. 18.

Additionally, a light source is placed on the substrate (Block 706). As illustrated in FIG. 19C, a light source 508 can be placed on the substrate 502. In an exemplary implementation, the light source 508 can be placed on the substrate 502 and/or within a second cavity 507 using pick-and-place surface mount techniques. Placing the light source 508 on the substrate 502 can include using a reflow process for coupling a solder connection on the light source 508 to a corresponding connection on the substrate 502. It is contemplated that the light source 508 may be placed on the substrate 502 proximate in time to placing the application specific integrated circuit 504 and solder connections on the application specific integrated circuit 504 and the light source 508 simultaneously reflowed.

Figure 19D:
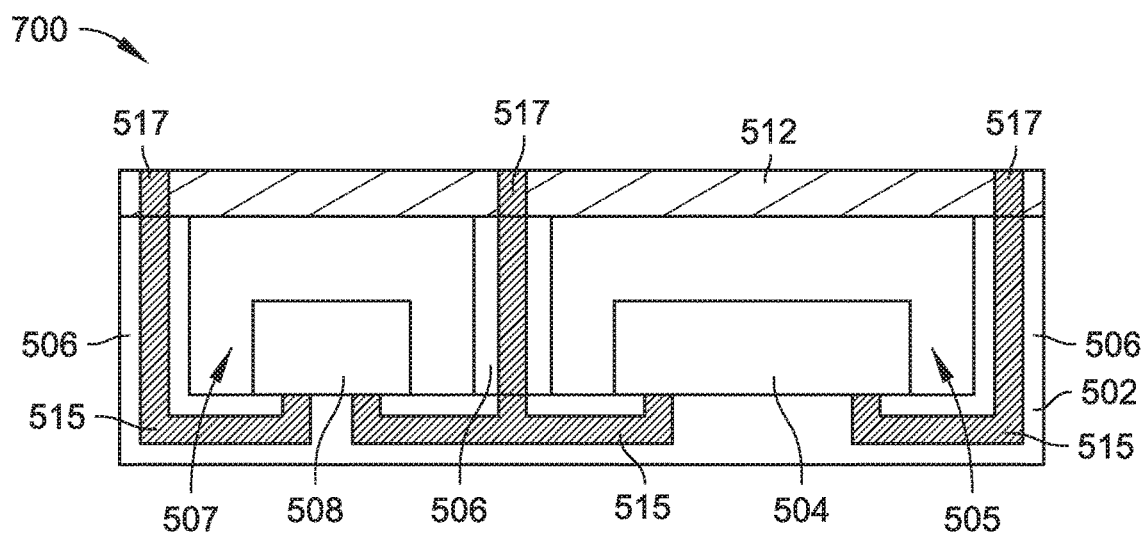
FIG. 19D is a diagrammatic partial cross-sectional side elevation view illustration of the fabrication of an optical sensor package with a switchable layer, such as the optical sensor packages shown in FIGS. 16A through 16D in accordance with the process shown in FIG. 18.

Next, a glass layer is placed on the at least one wall, where the substrate, the at least one wall, and the glass layer define a first cavity and a second cavity (Block 708). As shown in FIG. 19D, a cover layer 512 is placed on the at least one wall 506 subsequent to placing the application specific integrated circuit 504 and the light source 508. Placing the cover layer 512 can include using an automated pick-and place process to apply an adhesive, place the cover layer 512 on the adhesive, and/or cure the adhesive. Additionally, placing the cover layer 512 on the at least one wall 506 can include forming at least one through-glass via 517 in the cover layer 512. Forming at least one through-glass via 517 can include etching, drilling, and/or singulating a glass panel. It is contemplated that other processes may be used to form a through-glass via 517 and/or place a cover layer 512, such as forming at least on metallic lead (e.g., ITO) on the cover layer 512, for example, using a deposition and/or etching process.

Figure 19E:
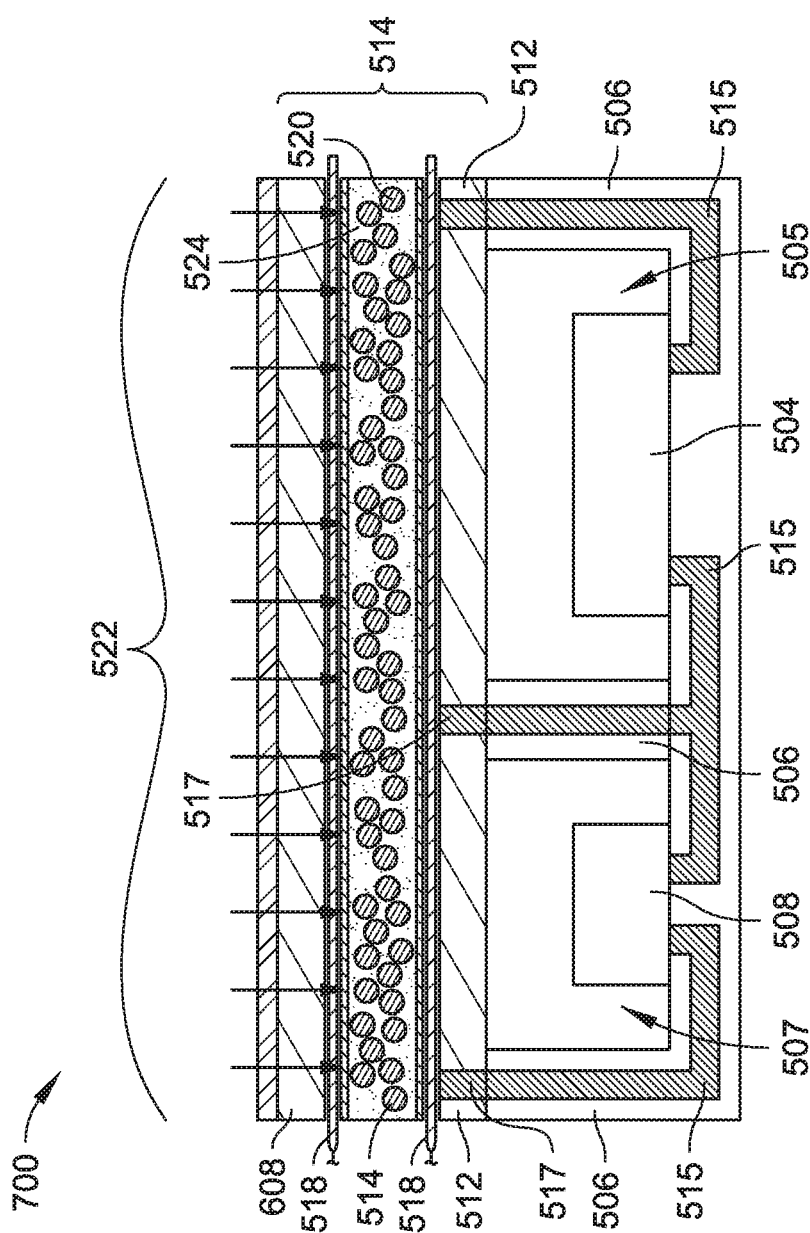
FIG. 19E is a diagrammatic partial cross-sectional side elevation view illustration of the fabrication of an optical sensor package with a switchable layer, such as the optical sensor packages shown in FIGS. 16A through 16D in accordance with the process shown in FIG. 18.

Then, a switchable layer is placed on the glass layer (Block 710). As shown in FIG. 19E, a switchable layer 514 can be placed on the cover layer 512. In implementations, the switchable layer 514 can be placed on the cover layer 512 using an automated process to place and/or fit the switchable layer 514. Additionally, placing the switchable layer 514 can include forming an electrical connection between the switchable layer 514 and the optical sensor package 400, such as forming a solder connection between the switchable layer 514 and/or conductive coating 518 and a through-glass via 517. In one implementation, placing the switchable layer 514 can include placing individual layers separately. For example, placing the switchable layer 514 can include placing a first glass layer (cover layer) 512 placing a switchable film on the first glass layer, and placing a second (top) glass layer 608 on the switchable film. It is contemplated that other processes may be utilized to place the switchable layer 514 on the cover layer 512.

Figure 22:
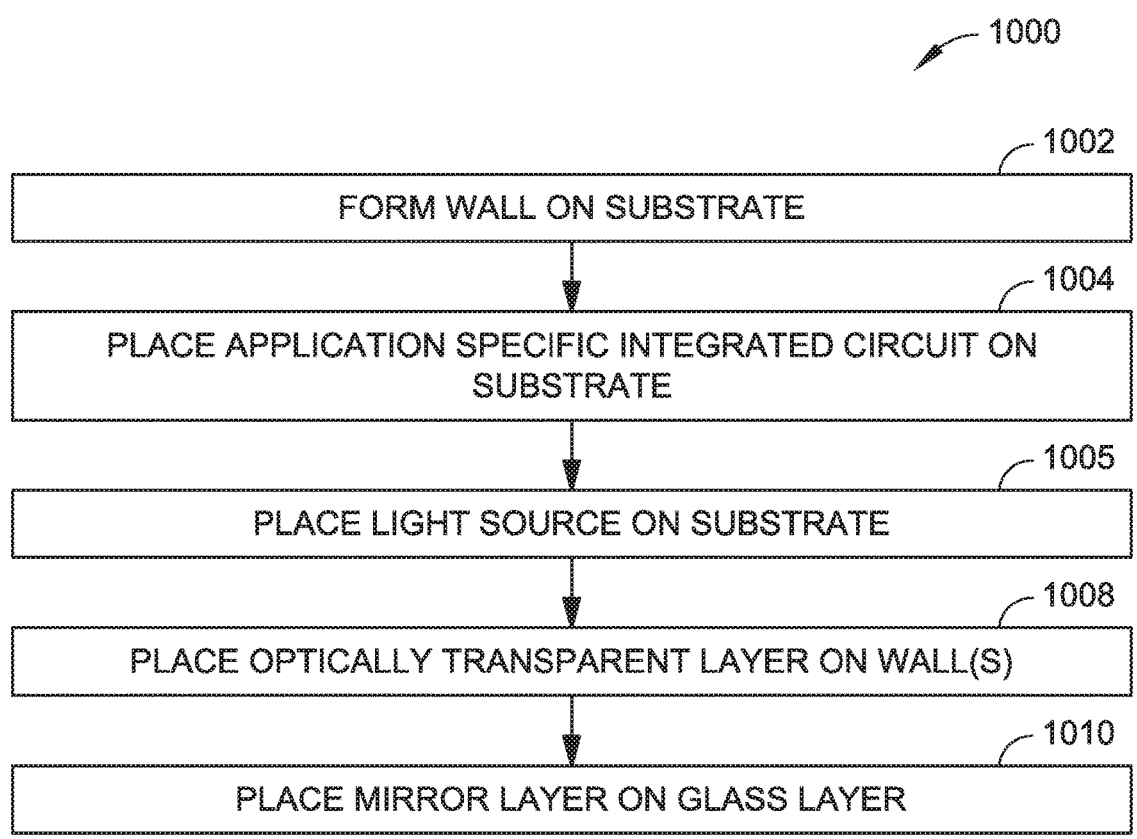
FIG. 22 is a flow diagram illustration of an example process for fabricating an optical sensor package with a mirror layer, such as the optical sensor packages illustrated in FIGS. 21A through 21E.

FIG. 22 illustrates an example process 1000 that employs techniques to fabricate an optical sensor package, such as the optical sensor package 800 shown in FIGS. 20A through 21E. FIGS. 23A through 23E illustrate a section of an optical sensor package during fabrication, for example the optical sensor package 800 shown in FIGS. 20A through 21E. In general, operations of disclosed processes (e.g., process 1000) may be performed in an arbitrary order, unless otherwise provided in the claims.

In the process 1000 illustrated, at least one wall is formed on a substrate (Block 1002). In the implementation shown in FIG. 23A, at least one wall 806 is placed or otherwise formed on the substrate 802 in a perpendicular configuration (e.g., a wall 806 extends away from the substrate 802). In one implementation, forming the wall(s) 806 on the substrate 802 can include using a pick-and-place and bonding operation to place individual walls 806. In another implementation, forming the wall 806 on the substrate 802 can include using an etching process to selectively etch a portion of the substrate 802 (e.g., a glass or ceramic) to form a first cavity 805 and/or a second cavity 807. It is contemplated that a variety of processes can be used for forming at least one wall 806 on a substrate 802. Additionally, forming at least one wall 806 on the substrate 802 may include forming at least one electrical connection (e.g., a redistribution layer, a contact pad, and so forth) in and/or on the substrate 802 and/or at least one wall 806 using deposition, lithographic, and/or etching processes.

Figure 23A:
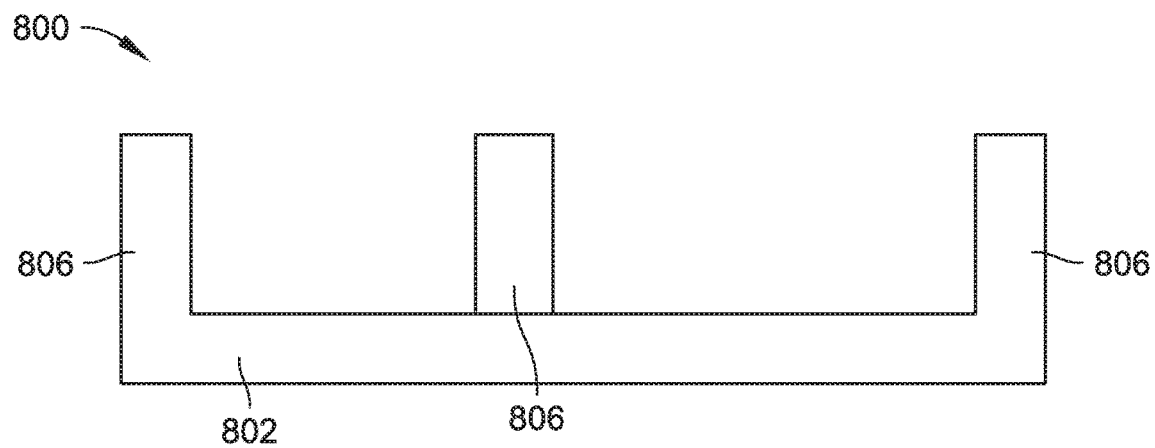
FIG. 23A is a diagrammatic partial cross-sectional side elevation view illustration of the fabrication of an optical sensor package with a mirror layer, such as the optical sensor packages shown in FIGS. 21A through 21E in accordance with the process shown in FIG. 22.
Figure 23B:
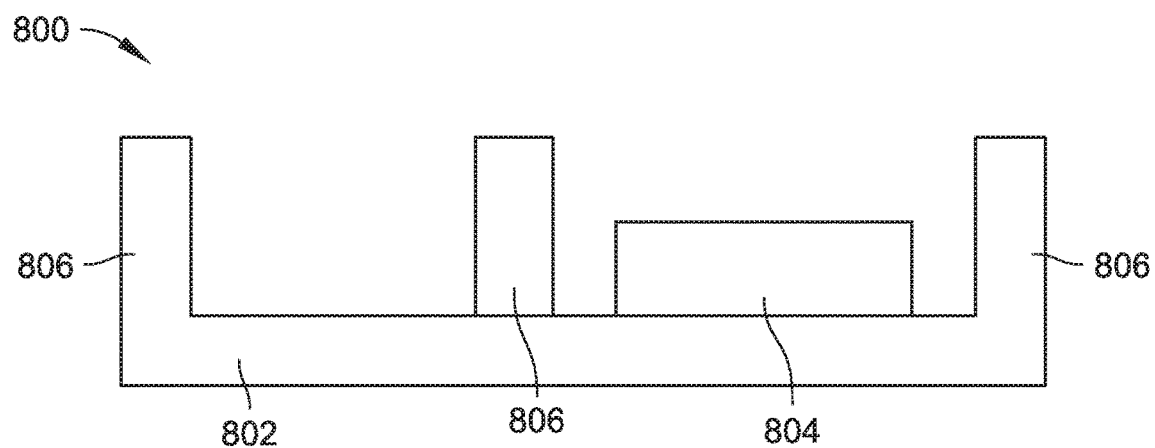
FIG. 23B is a diagrammatic partial cross-sectional side elevation view illustration of the fabrication of an optical sensor package with a mirror layer, such as the optical sensor packages shown in FIGS. 21A through 21E in accordance with the process shown in FIG. 22.

Then, an application specific integrated circuit is placed on the substrate (Block 1004). As illustrated in FIG. 23B, an application specific integrated circuit 804 can be placed on the substrate 802. In an exemplary implementation, the application specific integrated circuit 804 can be placed on the substrate 802 and/or within a first cavity 805 using pick-and-place surface mount techniques. Placing the application specific integrated circuit 804 on the substrate 802 can include using a reflow process for coupling a solder connection on the application specific integrated circuit 804 to a corresponding connection on the substrate 802.

Figure 23C:
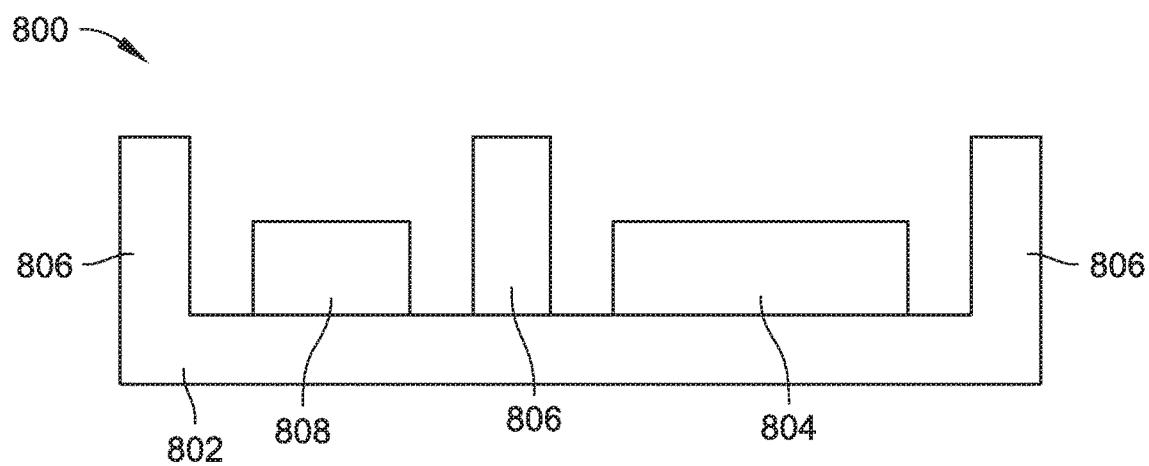
FIG. 23C is a diagrammatic partial cross-sectional side elevation view illustration of the fabrication of an optical sensor package with a mirror layer, such as the optical sensor packages shown in FIGS. 21A through 21E in accordance with the process shown in FIG. 22.

Additionally, a light source is placed on the substrate (Block 1006). As illustrated in FIG. 23C, a light source 808 can be placed on the substrate 802. In an exemplary implementation, the light source 808 can be placed on the substrate 802 and/or within a second cavity 807 using pick-and-place surface mount techniques. Placing the light source 808 on the substrate 802 can include using a reflow process for coupling a solder connection on the light source 808 to a corresponding connection on the substrate 802. It is contemplated that the light source 808 may be placed on the substrate 802 proximate in time to placing the application specific integrated circuit 804, and in some implementations, solder connections on the application specific integrated circuit 804 and the light source 808 may be simultaneously reflowed.

Figure 23D:
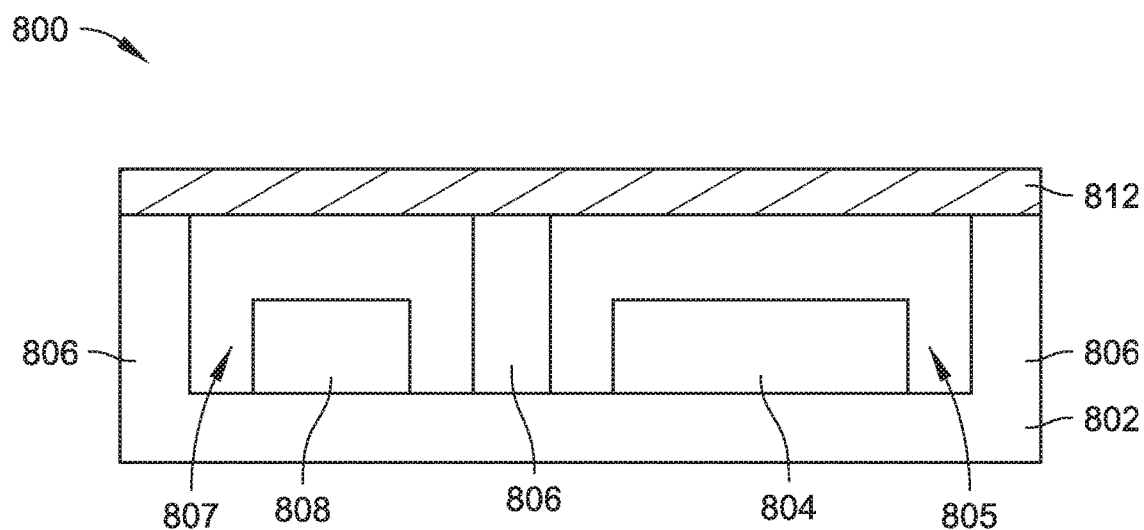
FIG. 23D is a diagrammatic partial cross-sectional side elevation view illustration of the fabrication of an optical sensor package with a mirror layer, such as the optical sensor packages shown in FIGS. 21A through 21E in accordance with the process shown in FIG. 22.

Next, an optically transparent layer is placed in the at least one wall, where the substrate, the at least one wall, and the optically transparent layer define a first cavity and a second cavity (Block 1008). As shown in FIG. 23D, an optically transparent layer 812 is placed on the at least one wall 806 subsequent to placing the application specific integrated circuit 804 and the light source 808. Placing the optically transparent layer 812 can include using an automated pick-and-place process to apply an adhesive, place the optically transparent layer 812 on the adhesive, and/or cure the adhesive.

Figure 23E:
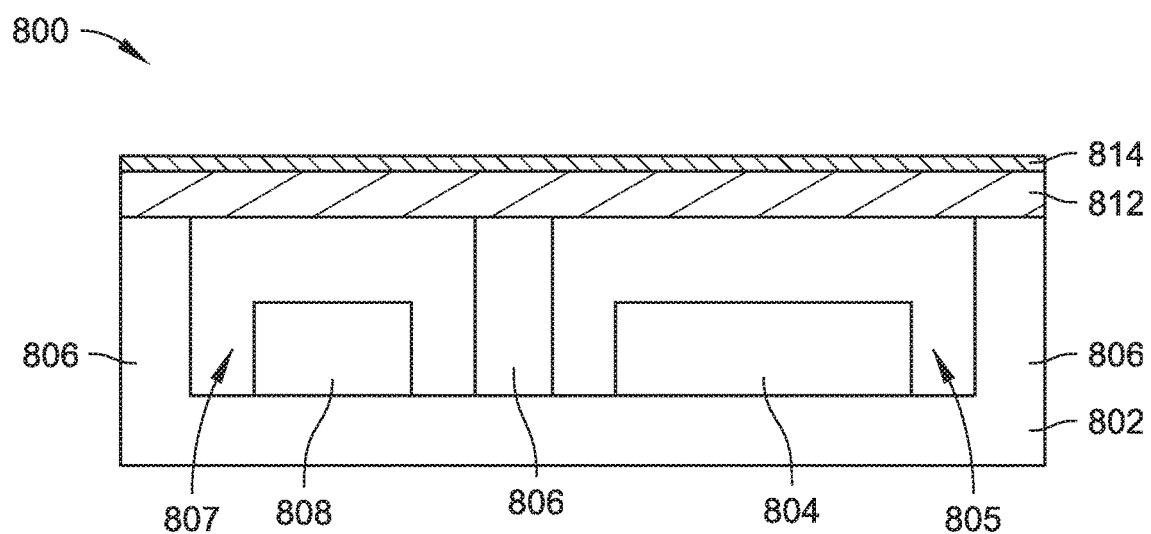
FIG. 23E is a diagrammatic partial cross-sectional side elevation view illustration of the fabrication of an optical sensor package with a mirror layer, such as the optical sensor packages shown in FIGS. 21A through 21E in accordance with the process shown in FIG. 22.

Then, a mirror layer is placed on the optically transparent layer (Block 1010). As shown in FIG. 23E, a mirror layer 814 can be placed on the optically transparent layer 812. In some implementations, the mirror layer 814 can be placed on the optically transparent layer 812 using an automated process to place and/or fit the mirror layer 814, such as when the mirror layer 814 is placed as a film and/or sheet. In other implementations, the mirror layer 814 can be placed and/or formed using deposition techniques, such as sputtering. In one implementation, placing the mirror layer 814 can include sputtering a layer of aluminum onto the optically transparent layer 812. In some implementations, placing the mirror layer 814 can include placing at least one additional mirror layer 814 on the optically transparent layer 812 (e.g., a mirror layer is placed on opposite sides of the optically transparent layer 812). It is contemplated that other processes may be utilized to place the mirror layer 814 on the optically transparent layer 812. In implementations, the mirror layer 814 can be placed on the optically transparent layer 812 before or after placing the optically transparent layer 812 on the at least one wall 806. Additionally, in some instances, the mirror layer 814 can be placed on only a portion of the optically transparent layer 812 (e.g., only over the portion corresponding to the first cavity 805 and/or the second cavity 807).

Some additional processes in fabricating an optical sensor package 800 and/or a mobile device 900 may include segmenting the optical sensor package 800 from a panel (e.g., a substrate, a wafer), coupling the optical sensor package 800 to an external device, such as a printed circuit board in a mobile device 900, and/or using a reflow process.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. An optical sensor package, comprising:
   a substrate;
   at least one wall disposed on the substrate;
   at least one glass layer disposed on the at least one wall, where the substrate, the at least one wall, and the at least one glass layer define a first cavity and a second cavity;
   at least one application specific integrated circuit disposed on the substrate and within the first cavity;
   at least one light source disposed on the substrate and within the second cavity; and
   a switchable layer disposed on the at least one glass layer, wherein the switchable layer comprises a thermochromic layer.

2. The optical sensor package as recited in claim 1, further comprising at least a second glass layer, wherein the switchable layer is disposed between the first glass layer and the second glass layer.

3. The optical sensor package as recited in claim 1, wherein the switchable layer comprises electrically switchable smart glass.

4. The optical sensor package as recited in claim 1, wherein the at least one application specific integrated circuit comprises an optical sensor selected from a photodiode or a thermopile.

5. The optical sensor package as recited in claim 1, further comprising:
   at least one through-glass via disposed in the at least one glass layer, where the at least one through-glass via electrically connects the switchable layer with a redistribution layer disposed in the at least one wall.

6. The optical sensor package as recited in claim 1, wherein the at least one application specific integrated circuit comprises an optical sensor selected from a photodiode or a thermopile.

7. The optical sensor package as recited in claim 1, wherein the switchable layer comprises a thermochromic layer.

8. An optical sensor package, comprising:
   a substrate;
   at least one wall disposed on the substrate;
   at least one optically transparent layer disposed over the at least one wall, where the substrate, the at least one wall, and the at least one optically transparent layer define a first cavity and a second cavity;
   at least one application specific integrated circuit disposed on the substrate and within the first cavity;

at least one light source disposed on the substrate and within the second cavity;

at least one mirror layer disposed on the at least one optically transparent layer, where the at least one mirror layer obscures the optical sensor package;

a switchable layer disposed on the at least one optically transparent layer, wherein the switchable layer comprises a thermochromic layer.

9. The optical sensor package as recited in claim 8, wherein the at least one application specific integrated circuit comprises an optical sensor.

10. The optical sensor package as recited in claim 8, wherein the at least one mirror layer comprises aluminum.

11. The optical sensor package as recited in claim 8, wherein the at least one mirror layer comprises a first mirror layer disposed on a first side of the at least one optically transparent layer and a second mirror layer disposed on a second side of the at least one optically transparent layer.

12. The optical sensor package as recited in claim 8, wherein the at least one mirror layer is disposed on a side of the at least one optically transparent layer facing the substrate or on a side of the at least one optically transparent layer distal the substrate.

13. The optical sensor package as recited in claim 8, wherein the at least one mirror layer is partially disposed on the at least one optically transparent layer.

14. The optical sensor package as recited in claim 8, wherein the at least one optically transparent layer comprises a first optically transparent layer and a second optically transparent layer, where the at least one mirror layer is disposed between the first optically transparent layer and the second optically transparent layer.

15. An optical sensor package, comprising:
a substrate;
at least one wall disposed on the substrate;
at least one glass layer disposed on the at least one wall, where the substrate, the at least one wall, and the at least one glass layer define a first cavity and a second cavity;
at least one application specific integrated circuit disposed on the substrate and within the first cavity;
at least one light source disposed on the substrate and within the second cavity;
a switchable layer disposed on the at least one glass layer; and
at least one through-glass via disposed in the at least one glass layer, where the at least one through-glass via electrically connects the switchable layer with a redistribution layer disposed in the at least one wall.

16. The optical sensor package as recited in claim 15, further comprising at least a second glass layer, wherein the switchable layer is disposed between the first glass layer and the second glass layer.

17. The optical sensor package as recited in claim 15, wherein the switchable layer comprises electrically switchable smart glass.

* * * * *